US006764889B2

(12) United States Patent
Baliga

(10) Patent No.: US 6,764,889 B2
(45) Date of Patent: Jul. 20, 2004

(54) METHODS OF FORMING VERTICAL MOSFETS HAVING TRENCH-BASED GATE ELECTRODES WITHIN DEEPER TRENCH-BASED SOURCE ELECTRODES

(75) Inventor: Bantval Jayant Baliga, Raleigh, NC (US)

(73) Assignee: Silicon Semiconductor Corporation, Research Triangle Park, NC (US)

(*) Notice: Subject to any disclaimer, the term of this patent is extended or adjusted under 35 U.S.C. 154(b) by 0 days.

(21) Appl. No.: 10/621,668

(22) Filed: Jul. 17, 2003

(65) Prior Publication Data

US 2004/0016963 A1 Jan. 29, 2004

Related U.S. Application Data

(60) Division of application No. 09/995,109, filed on Nov. 26, 2001, now Pat. No. 6,621,121, which is a continuation-in-part of application No. 09/602,414, filed on Jun. 23, 2000, now Pat. No. 6,545,316, and a continuation-in-part of application No. 09/377,006, filed on Aug. 18, 1999, now Pat. No. 6,388,286, which is a continuation-in-part of application No. 09/178,845, filed on Oct. 26, 1998, now Pat. No. 5,998,833.

(51) Int. Cl.[7] .................... H01L 21/336; H01L 21/8234
(52) U.S. Cl. ....................................... 438/197; 438/270
(58) Field of Search ............................... 438/197, 212, 438/268, 270

(56) References Cited

U.S. PATENT DOCUMENTS

| 3,849,789 A | 11/1974 | Cordes et al. ................. 357/15 |
| 4,376,286 A | 3/1983 | Lidow et al. .................. 357/23 |

(List continued on next page.)

FOREIGN PATENT DOCUMENTS

| EP | 0 580 452 A1 | 1/1994 |
| EP | 0 726 602 A2 | 8/1996 |

(List continued on next page.)

OTHER PUBLICATIONS

Merchant et al., "Dependence of Breakdown Voltage on Drift Length and Buried Oxide Thickness in SOI Resurf LDMOS Transistors," 5th International Symposium on Power Semiconductor Devices and ICS, 1993 IEEE, pp. 124–128.

(List continued on next page.)

*Primary Examiner*—Richard Elms
*Assistant Examiner*—Beth E. Owens
(74) *Attorney, Agent, or Firm*—Myers Bigel Sibley & Sajovec

(57) ABSTRACT

Methods of forming vertical MOSFETs include forming a base region of second conductivity type in a semiconductor substrate having a drift region of first conductivity type therein that forms a P-N junction with the base region. A source region of first conductivity type is formed in the base region and a deep trench, having a first sidewall that extends adjacent the base region, is formed in the substrate. The deep trench is lined with a first electrically insulating layer. The deep trench is then refilled with a trench-based source electrode. The trench-based source electrode is selectively etched to define a shallow trench therein and expose a first portion of the first electrically insulating layer that extends on the first sidewall of the deep trench. The first portion of the first electrically insulating layer is selectively etched to expose an upper portion of the first sidewall of the deep trench and reveal the base region. The shallow trench is lined with a gate insulating layer that extends on the exposed upper portion of the first sidewall of the deep trench and a bottom and sidewalls of the shallow trench. A gate electrode is formed in the lined shallow trench. A surface source electrode is also formed. This source electrode electrically connects the trench-based source electrode, source region and base region together.

9 Claims, 20 Drawing Sheets

U.S. PATENT DOCUMENTS

| | | | |
|---|---|---|---|
| 4,419,811 A | 12/1983 | Rice | 29/571 |
| 4,590,509 A | 5/1986 | Esser et al. | 357/53 |
| 4,593,302 A | 6/1986 | Lidow et al. | 357/23.4 |
| 4,646,115 A | 2/1987 | Shannon et al. | 357/15 |
| 4,705,759 A | 11/1987 | Lidow et al. | 437/29 |
| 4,904,614 A | 2/1990 | Fisher et al. | 437/41 |
| 4,941,026 A | 7/1990 | Temple | 357/23.4 |
| 5,016,066 A | 5/1991 | Takahashi | 357/23.4 |
| 5,111,253 A | 5/1992 | Korman et al. | 257/471 |
| 5,113,236 A | 5/1992 | Arnold et al. | 357/41 |
| 5,126,807 A | 6/1992 | Baba et al. | 357/23.4 |
| 5,132,753 A | 7/1992 | Chang et al. | 357/23.4 |
| 5,177,572 A | 1/1993 | Murakami | 257/260 |
| 5,213,986 A | 5/1993 | Pinker et al. | 437/20 |
| 5,216,807 A | 6/1993 | Yoshizawa et al. | 29/876 |
| 5,229,633 A | 7/1993 | Fisher et al. | 257/339 |
| 5,233,215 A | 8/1993 | Baliga | 257/490 |
| 5,246,870 A | 9/1993 | Merchant | 437/21 |
| 5,283,201 A | 2/1994 | Tsang et al. | 437/31 |
| 5,298,442 A | 3/1994 | Bulucea et al. | 437/40 |
| 5,300,448 A | 4/1994 | Merchant et al. | 437/41 |
| 5,316,959 A | 5/1994 | Kwan et al. | 437/40 |
| 5,323,040 A | 6/1994 | Baliga | 257/332 |
| 5,338,961 A | 8/1994 | Lidow et al. | 257/342 |
| 5,350,932 A | 9/1994 | Malhi | 257/67 |
| 5,362,979 A | 11/1994 | Merchant | 257/340 |
| 5,365,102 A | 11/1994 | Mehrotra et al. | 257/475 |
| 5,391,908 A | 2/1995 | Walker et al. | 257/409 |
| 5,396,085 A | 3/1995 | Baliga | 257/77 |
| 5,412,241 A | 5/1995 | Merchant | 257/342 |
| 5,424,231 A | 6/1995 | Yang | 437/40 |
| 5,445,978 A | 8/1995 | Yilmaz | 437/41 |
| 5,545,908 A | 8/1996 | Tokura et al. | 257/341 |
| 5,578,508 A | 11/1996 | Baba et al. | 437/35 |
| 5,578,851 A | 11/1996 | Hshieh et al. | 257/333 |
| 5,612,567 A | 3/1997 | Baliga | 257/475 |
| 5,623,152 A | 4/1997 | Majumdar et al. | 257/330 |
| 5,637,898 A | 6/1997 | Baliga | 257/330 |
| 5,640,034 A | 6/1997 | Malhi | 257/341 |
| 5,648,671 A | 7/1997 | Merchant | 257/347 |
| 5,661,322 A | 8/1997 | Williams et al. | 257/331 |
| 5,672,526 A | 9/1997 | Kawamura | 437/41 R |
| 5,674,766 A | 10/1997 | Darwish et al. | 437/40 |
| 5,679,966 A | 10/1997 | Baliga et al. | 257/139 |
| 5,688,725 A | 11/1997 | Darwish et al. | 438/270 |
| 5,710,451 A | 1/1998 | Merchant | 257/347 |
| 5,710,455 A | 1/1998 | Bhatnagar et al. | 257/472 |
| 5,731,627 A | 3/1998 | Seok | 257/630 |
| 5,742,076 A | 4/1998 | Sridevan et al. | 257/77 |
| 5,744,994 A | 4/1998 | Williams | 327/374 |
| 5,753,938 A | 5/1998 | Thapar et al. | 257/77 |
| 5,756,386 A | 5/1998 | Blanchard | 435/270 |
| 5,767,547 A | 6/1998 | Merchant et al. | 257/347 |
| 5,831,288 A | 11/1998 | Singh et al. | 257/77 |
| 5,844,275 A | 12/1998 | Kitamura et al. | 257/335 |
| 5,885,878 A | 3/1999 | Fujishima et al. | 438/302 |
| 5,918,137 A | 6/1999 | Ng et al. | 438/454 |
| 5,962,893 A | 10/1999 | Omura et al. | 257/329 |
| 5,973,360 A | 10/1999 | Tihanyi | 257/330 |
| 5,998,833 A | 12/1999 | Baliga | 257/329 |
| 6,091,108 A | 7/2000 | Harris et al. | 257/339 |
| 6,388,286 B1 | 5/2002 | Baliga | 257/330 |
| 6,452,230 B1 | 9/2002 | Boden, Jr. | 257/341 |

FOREIGN PATENT DOCUMENTS

| | | |
|---|---|---|
| JP | 63-296282 | 2/1988 |
| WO | WO 97/43789 | 11/1997 |
| WO | WO 99/56311 | 11/1999 |

OTHER PUBLICATIONS

Merchant et al., "Realization of High Breakdown Voltage (>700 V) in This SOI Devices," Philips Laboratories, North American Philips Corporation, 1991 IEEE, pp. 31–35.

Sunkavalli et al., "Step Drift Doping Profile for High Voltage DI Lateral Power Devices," Proceedings 1995 IEEE International SOI Conference, Oct. 1995, pp. 139–140.

Yamaguchi, Ken, "Field–Dependent Mobility Model for Two–Dimensional Numerical Analysis of MOSFET's," IEEE Transactions on Electron Devices, vol. ED–26, No. 7, Jul. 1979, pp. 1068–1074.

METHODS OF FORMING VERTICAL MOSFETS HAVING TRENCH-BASED GATE ELECTRODES WITHIN DEEPER TRENCH-BASED SOURCE ELECTRODES

REFERENCE TO PRIORITY APPLICATIONS

This application is a divisional of U.S. application Ser. No. 09/995,109, filed Nov. 26, 2001, now U.S. Pat. No. 6,621,121 which is a continuation-in-part (CIP) of U.S. application Ser. No. 09/602,414, filed Jun. 23, 2000, now U.S. Pat. No. 6,545,316 and a continuation-in-part (CIP) of U.S. application Ser. No. 09/377,006, filed Aug. 18, 1999, now U.S. Pat. No. 6,388,286; U.S. application Ser. No. 09/377,006 is a continuation-in-part (CIP) of U.S. Ser. No. 09/178,845, filed Oct. 26, 1998, now U.S. Pat. No. 5,998,833. The disclosures of U.S. application Ser. Nos. 09/995,109, 09/602,414, 09/377,006 and 09/178,845 are hereby incorporated herein by reference.

FIELD OF THE INVENTION

The present invention relates to semiconductor switching devices, and more particularly to switching devices for high power applications and methods of forming same.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices that require relatively large base currents, typically one fifth to one tenth of the collector current, to maintain the transistor in an operating mode. Proportionally larger base currents can be expected for applications that also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement mode MOSFET occurs when a conductive N-type inversion layer channel is formed in the P-type base region (also referred to as "channel region") in response to the application of a positive gate bias. The inversion layer channel electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

In view of these desirable characteristics, many variations of power MOSFETs have been designed. Two popular types are the double-diffused MOSFET device (DMOSFET) and the UMOSFET device. These and other power MOSFETs are described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into an N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 $\mu\Omega\text{cm}^2$ were experimentally demonstrated for devices capable of supporting a maximum of 25 volts. However, the performance of these devices was limited by the fact that the forward blocking voltage must be supported across the gate oxide at the bottom of the trench.

FIG. 1, which is a reproduction of FIG. 1(d) from the aforementioned Syau et al. article, discloses a conventional UMOSFET structure. In the blocking mode of operation, this UMOSFET supports most of the forward blocking voltage across the N-type drift layer that must be doped at relatively low levels to obtain a high maximum blocking voltage capability, however low doping levels typically increase the on-state series resistance. Based on these competing design requirements of high blocking voltage and low on-state resistance, a fundamental figure-of-merit for power devices has been derived that relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp} = 5.93 \times 10^{-9} \, (BV)^{2.5} \tag{1}$$

Thus, for a device with 60 volt blocking capability, the ideal specific on-resistance is 170 $\mu\Omega\text{cm}^2$. However, because of the additional resistance contribution from the base region (e.g., P-type base region in an N-channel MOSFET), reported specific on-resistances for UMOSFETs are typically much higher. For example, a UMOSFET having a specific on-resistance of 730 $\mu\Omega\text{cm}^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251 (1989). However, in this device, a lower-than-ideal uniform doping concentration in the drift region was required to compensate for the high concentration of field lines near the bottom corner of the trench when blocking high forward voltages. U.S. Pat. Nos. 5,637,989, 5,742,076 and 5,912,497, the disclosures of which are hereby incorporated herein be reference, also disclose popular power semiconductor devices having vertical current carrying capability.

In particular, U.S. Pat. No. 5,637,898 to Baliga discloses a preferred silicon field effect transistor that is commonly referred to as a graded-doped (GD) UMOSFET. As illustrated by FIG. 2, which is a reproduction of FIG. 3 from the '898 patent, a unit cell 100 of an integrated power semiconductor device field effect transistor may have a width "$W_c$" of 1 $\mu$m and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 $\mu$m on an N-type drain layer 114 having a thickness of 100 $\mu$m and a doping concentration of greater than $1\times10^{18}$ cm$^{-3}$ (e.g. $1\times10^{19}$ cm$^{-3}$) therein. The drift layer 112 also has a linearly graded doping concentration therein with a maximum concentration of $3\times10^{17}$ cm$^{-3}$ at the N+/N junction with the drain layer 114, and a minimum concentration of $1\times10^{16}$ cm$^{-3}$ beginning at a distance 3 $\mu$m from the N+/N junction (i.e., at a depth of 1 $\mu$m) and continuing at a uniform level to the upper face. The base layer 116 may be formed by implanting a P-type dopant such as boron into the drift layer 112 at an energy of 100 keV and at a dose level of $1\times10^{14}$ cm$^{-2}$. The P-type dopant may then be diffused to a depth of 0.5 $\mu$m into the drift layer 112. An N-type dopant such as arsenic may also be implanted at an energy of 50 keV and at dose level of $1\times10^{15}$ cm$^{-2}$. The N-type and P-type dopants can then be diffused simultaneously to a depth of 0.5 $\mu$m and 1.0 $\mu$m, respectively, to form a composite semiconductor substrate containing the drain, drift, base and source layers.

A stripe-shaped trench having a pair of opposing sidewalls 120a that extend in a third dimension (not shown) and a bottom 120b is then formed in the substrate. For a unit cell 100 having a width $W_c$ of 1 $\mu$m, the trench is preferably formed to have a width "$W_t$" of 0.5 $\mu$m at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially uniform potential gradient along the trench sidewalls 120a. The portion of the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 $\mu\Omega\text{cm}^2$, which is four (4) times smaller than the ideal specific on-resistance of 170 $\mu\Omega\text{cm}^2$ for a 60 volt power UMOSFET, can be achieved. Notwithstanding these excellent characteristics, the transistor of FIG. 2 may suffer from a relatively low high-frequency figure-of-merit (HFOM) if the overall gate-to-drain capacitance ($C_{GD}$) is too large. Improper edge termination of the MOSFET may also prevent the maximum blocking voltage from being achieved.

Additional prior art MOSFETs are also disclosed in JP 63-296282 (Sony Corp), published Dec. 12, 1988. In particular, JP 63-296282 discloses a MOSFET with first and second gate electrodes built up in a trench and with a gate insulating film therebetween. U.S. Pat. No. 5,578,508 to Baba et al. discloses a vertical power MOSFET that utilizes a buried polysilicon layer within a trench as an ion implantation mask layer that prevents ions from being implanted into the trench bottom at the time of the channel ion implantation. U.S. Pat. No. 5,283,201 to Tsang et al. also discloses a vertical MOSFET having a recessed gate electrode. U.S. Pat. No. 4,941,026 to Temple discloses a vertical channel semiconductor device that includes an insulated gate electrode disposed adjacent a substantial portion of a voltage supporting region. In response to an appropriate bias, the control electrode couples to an electric field originating on charges within the voltage supporting region to reorient the electric field associated with those charges toward the gate electrode and transverse to the direction of current flow through the device.

Thus, notwithstanding these attempts to develop power semiconductor devices that can be switched at high speed and have high maximum blocking voltage capability and low specific on-resistance, there still continues to be a need to develop power devices having improved electrical characteristics.

SUMMARY OF THE INVENTION

It is therefore an object of the present invention to provide integrated circuit power devices having low on-state resistance and high maximum blocking voltage capability, and methods of forming same.

It is another object of the present invention to provide integrated circuit power devices having excellent high frequency switching characteristics, and methods of forming same.

It is still another object of the present invention to provide integrated circuit power devices having reduced susceptibility to parasitic oxide breakdown, and methods of forming same.

These and other objects, advantages and features of the present invention are provided by integrated power semiconductor device that may comprise a plurality of graded-doped (GD) UMOSFET unit cells having, among other things, improved high frequency switching performance, improved edge termination characteristics and reduced on-state resistance. The preferred integrated power semiconductor devices may also include integral Schottky barrier flyback diodes and shielded gate insulating regions.

According to one embodiment of the present invention, a GD-UMOSFET is provided having an upper trench-based gate electrode and a lower trench-based source electrode. The use of the trench-based source electrode instead of a larger gate electrode that occupies the entire trench reduces the gate-to-drain capacitance ($C_{GD}$) of the UMOSFET and thereby improves switching speed by reducing the amount of gate charging and discharging current that is needed during high frequency operation. In this embodiment of an integrated power semiconductor device, a plurality of GD-UMOSFET unit cells may be provided side-by-side in a semiconductor substrate having first and second opposing faces. Source and drain regions of first conductivity type (e.g., N+) are also provided in the substrate. The source region may extend adjacent the first face and the drain region may extend adjacent the second face. A drift region of first conductivity type is also provided in the substrate. The drift region, which forms a non-rectifying junction with the drain region, may be formed as an epitaxial layer of predetermined thickness and the doping profile in the drift region may be linearly graded and decrease in a direction from the drain region to the first face. For an enhancement mode UMOSFET device, a base region of second conductivity type (e.g., P-type) is formed in the substrate. The base region extends between the source region and the drift region and forms first and second P-N junctions therewith, respectively.

A plurality of trenches are also provided in the substrate, at the first face. These trenches may be formed as parallel stripe-shaped trenches. With respect to a particular unit cell, a first trench may be provided having opposing sidewalls when viewed in transverse cross-section. One of these sidewalls preferably extends adjacent the drift region and the base region. The first trench may also have a bottom that extends opposite the drain region. In particular, the bottom of the first trench may define an interface between an interior of the first trench and the drift region or an interior of the trench and the drain region, depending on the depth of the first trench and the thickness of the drift region. A gate electrode is also provided in the first trench. This gate electrode preferably extends opposite the base region so that a vertical inversion layer channel can be formed in the base region when an appropriate bias is applied to the gate electrode.

According to a preferred aspect of this embodiment of the present invention, a first source electrode is also provided in the first trench and this first source electrode extends between the gate electrode and the bottom of the first trench. An electrically insulating region is also provided in the first trench. This electrically insulating region extends along the sidewalls of the first trench, between the gate electrode and the first source electrode and between the first source electrode and the bottom of the trench. The inclusion of this source electrode adjacent the bottom of the first trench improves the breakdown and high frequency switching characteristics of the UMOSFET with only minimal impact on specific on-state resistance.

According to another preferred aspect of this invention, the electrically insulating region includes a gate insulating region having a first thickness (e.g., $T_2 \leq 750$ Å) as measured between the gate electrode and the sidewall of the first trench, and a source insulating region having a second thickness (e.g., $T_1 \geq 1500$ Å) as measured between the first source electrode and the same sidewall. In addition, a second source electrode is provided on the first face, in ohmic contact with the source region. The first and second source electrodes are electrically connected together.

Improved edge termination characteristics can also be achieved by forming a second trench that extends adjacent the first trench and defines an edge of the integrated power device comprising the plurality of side-by-side GD-UMOSFET unit cells. According to this aspect of the present invention, a uniformly thick first field plate insulating region is provided that lines the sidewalls and bottom of the second trench and a field plate is provided on the first field plate insulating region. This field plate is preferably connected to the source electrode. In addition, a second field plate insulating region is provided on the first face and this second field plate insulating region is contiguous with the first field plate insulating region. A field plate extension is provided on the second field plate insulating region and extends opposite the first face. This field plate extension is electrically connected to the field plate in the second trench.

To improve the edge termination and breakdown characteristics of the integrated power device even further, the second trench is positioned so that the first and second trenches define a transition mesa region therebetween. However, unlike the mesa regions that may be defined between trenches within the active area of the integrated power device, the transition mesa region is preferably formed to be devoid of a source region of first conductivity type. Instead, a preferred breakdown shielding region of second conductivity type (e.g., P+) is provided that extends to the first face and forms a third P-N junction with the drift region. Here, the breakdown shielding region may be formed deeper (and more highly doped) than the base region (and shallower than the first trench) to increase the likelihood that avalanche breakdown will occur in the transition mesa region instead of within the active area. This movement of avalanche breakdown away from the active area improves device reliability. According to still further aspects of the present invention, an integrated power semiconductor device may include an integral Schottky barrier diode (SBD) along one sidewall of a trench and a GD-UMOSFET along an opposing sidewall of the trench. In particular, a Schottky rectifying junction can be formed to a uniformly doped portion of the drift region that extends adjacent the first face. This composite SBD and GD-UMOSFET is valuable for motor control and synchronous rectifier applications.

According to other preferred embodiments of the present invention, UMOSFETs may be provided that comprise a semiconductor substrate having a source region and a drain contact region of first conductivity type therein and a trench in the substrate. An insulated gate electrode may also be provided in the trench. The trench also preferably comprises a buried source electrode that extends between the insulated gate electrode and a bottom of the trench. The buried source electrode and the source region are electrically connected together. A base region of second conductivity type is also provided in the semiconductor substrate. This base region extends to a sidewall of the trench so that application of a gate bias of sufficient magnitude to the insulated gate electrode induces formation of an inversion-layer channel in the base region.

A drift region of first conductivity type is provided that extends to the sidewall of the trench and opposite the buried source electrode. During operation, this drift region operates in a velocity saturation mode. To provide isolation and improve performance by enabling linear and velocity saturation operation modes in the channel and drift region, respectively, a transition region of first conductivity type is provided that extends between the drift region and the base region. This transition region forms non-rectifying and rectifying junctions with the drift region and base region, respectively. The transition region also has a higher first conductivity type doping concentration therein relative to a first conductivity type doping concentration in a portion of the drift region extending adjacent the non-rectifying junction. The UMOSFET may also constitute a GD-UMOSFET by doping the drift region so that it has a graded doping profile therein that increases in a direction extending from the non-rectifying junction to the drain region. The doping profile and shape of the base region may also be tailored so that the transition region become fully depleted as the voltage in the channel becomes close to the gate voltage.

Still further embodiments of the present invention include a semiconductor substrate having a drift region of first conductivity type therein and first and second trenches that extend lengthwise in a first direction in the substrate. These first and second trenches define a semiconductor mesa therebetween into which the drift region extends. First and second buried insulated source electrodes extend adjacent bottoms of the first and second trenches, respectively. First and second spaced-apart insulated gate electrodes are also provided. These gate electrodes do not extend lengthwise in respective trenches, but instead extend lengthwise in a second direction and overlap the mesa. Each of the gate electrodes also extends into a respective shallow trench within the first buried insulated source electrode and a respective shallow trench within the second buried insulated source electrode. The first and second directions may be orthogonal to each other.

Methods of forming these preferred vertical MOSFETs may include forming a base region of second conductivity type in a semiconductor substrate having a drift region of first conductivity type therein that forms a P-N junction with the base region. A source region of first conductivity type is also formed in the base region. A step is also performed to define a deep trench having a first sidewall that extends adjacent the base region, in the semiconductor substrate. This deep trench is then lined with a first electrically insulating layer. The lined deep trench is then filled with a trench-based source electrode. The trench-based source electrode is then selectively etched to define a plurality of shallow trenches therein that are spaced apart along the length of the trench-based source electrode. In each of these shallow trenches, a respective first portion of the first electrically insulating layer that extends on the first sidewall of the deep trench is exposed. Another etching step is then performed to remove the exposed first portions of the first electrically insulating layer and reveal the base region at multiple locations along the length of the trench-based source electrode. A thermal oxidation step is then performed on the portions of the base region that are revealed within the shallow trenches. This thermal oxidation step results in the formation of gate oxide layers on the revealed portions of the base region. A plurality of insulated gate electrodes are then formed on the surface of the substrate. Each of these insulated gate electrodes extends across the mesa(s) and into a respective shallow trench within each of the plurality of trench-based source electrodes. A surface source electrode is also provided that electrically connects the trench-based source electrode, source region and base region together.

DESCRIPTION OF PREFERRED EMBODIMENTS

Figure 1:
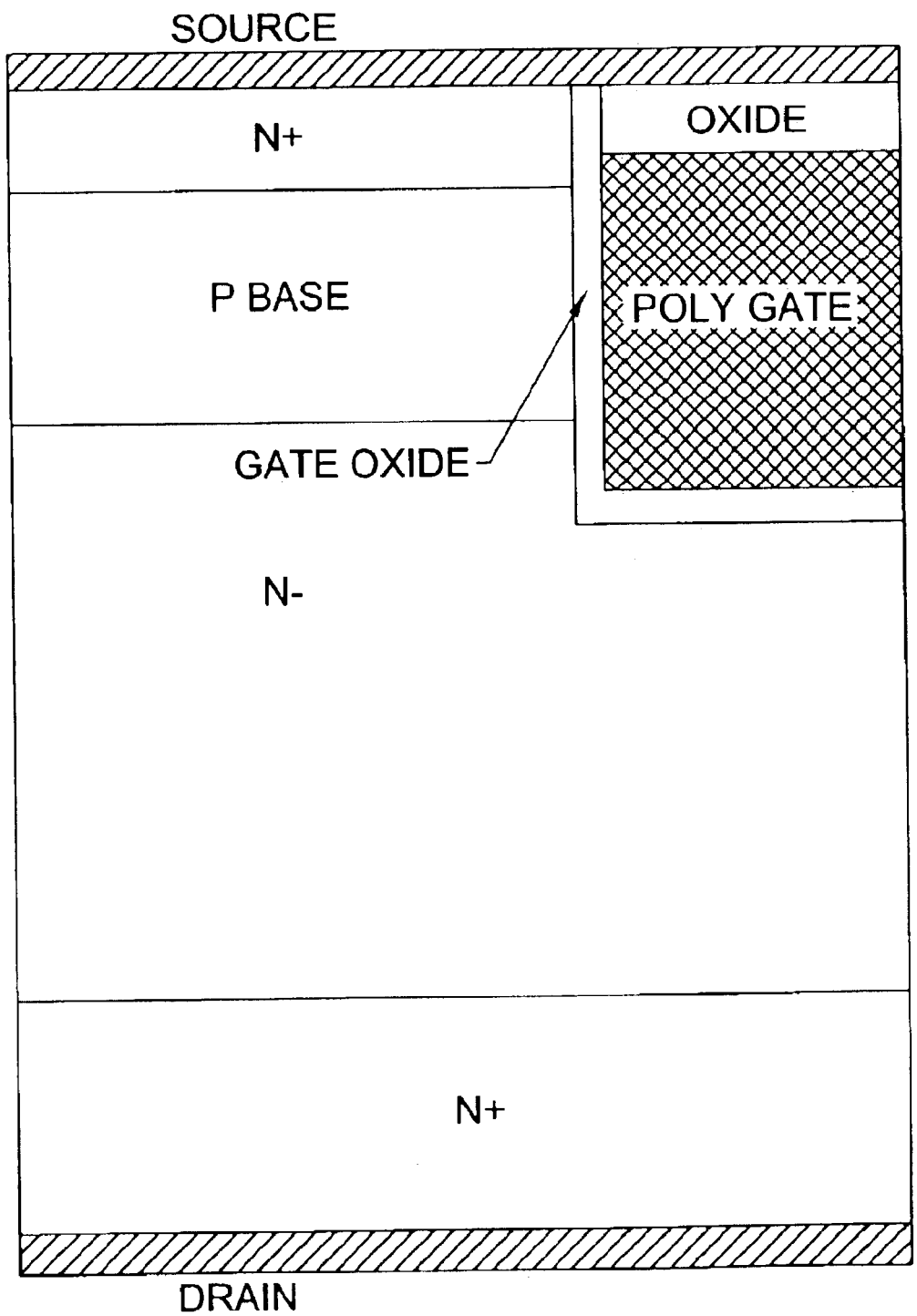
FIG. 1 is a cross-sectional view of a prior art power device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 3A:
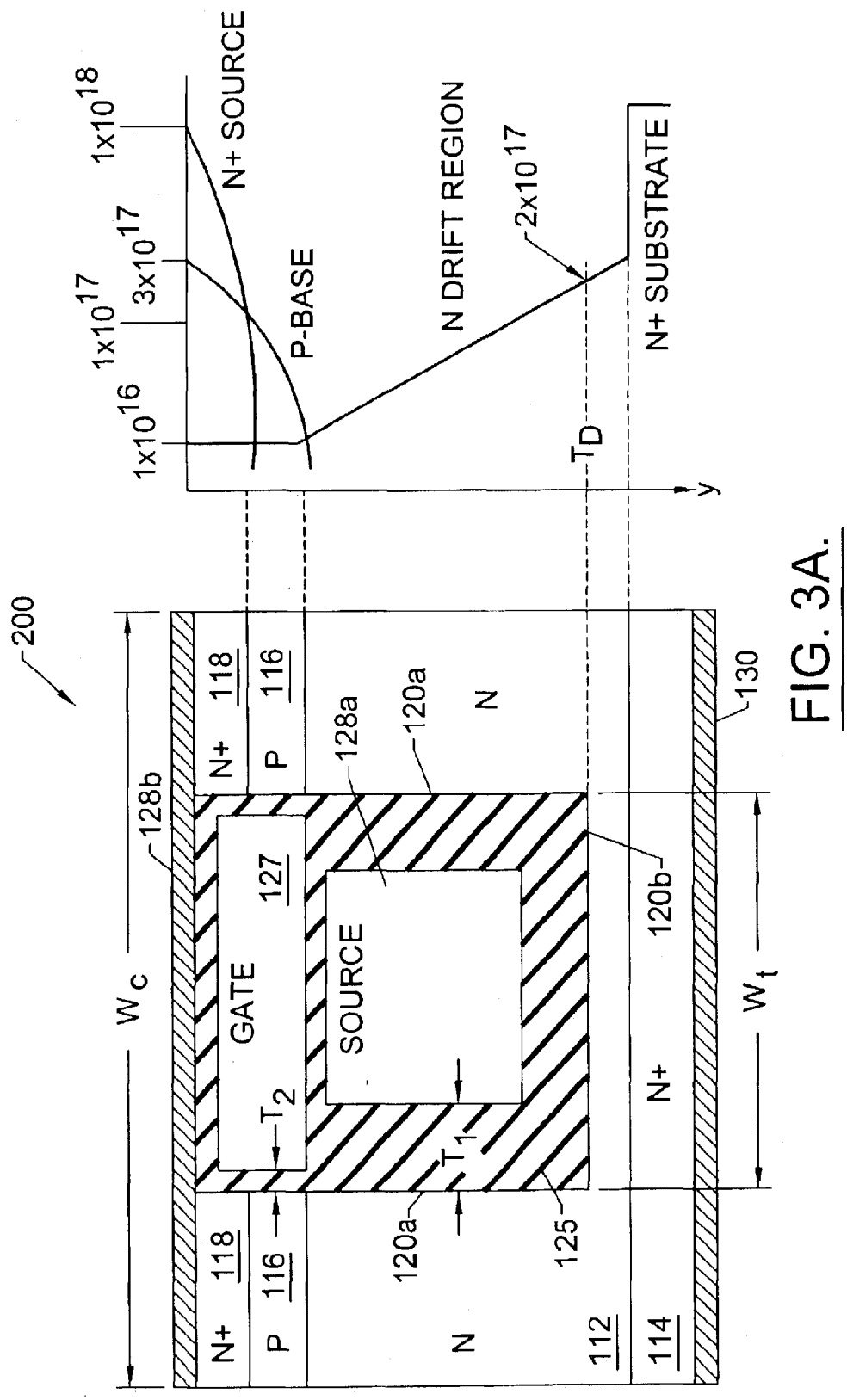
FIG. 3A is a cross-sectional view of a unit cell of an integrated power semiconductor device and doping profile therein, according to a first embodiment of the present invention.

Referring now to FIG. 3A, an integrated power semiconductor device according to a first embodiment of the present invention will be described. In particular, a unit cell 200 of a preferred integrated power semiconductor device has a predetermined width "$W_c$" (e.g., 1 μm) and comprises a highly doped drain layer 114 of first conductivity type (e.g., N+), a drift layer 112 of first conductivity type having a linearly graded doping concentration therein, a relatively thin base layer 116 of second conductivity type (e.g., P-type) and a highly doped source layer 118 of first conductivity type (e.g., N+). A source electrode 128b and drain electrode 130 may also be provided at the first and second faces, in ohmic contact with the source layer 118 and drain layer 114, respectively. The source electrode 128b also preferably forms an ohmic contact with the base layer 116 in a third dimension (not shown). The drift layer 112 may be formed by epitaxially growing an N-type in-situ doped monocrystalline silicon layer having a thickness of about 4 μm on an N-type drain layer 114 (e.g., N+ substrate) having a thickness of 100 μm and a first conductivity type doping concentration of greater than about $1\times10^{18}$ cm$^{-3}$ (e.g. $1\times10^{19}$ cm$^{-3}$) therein. As illustrated, the drift layer 112 may have a linearly graded doping concentration therein with a maximum concentration of greater than about $5\times10^{16}$ cm$^{-3}$ (e.g., $3\times10^{17}$ cm$^{-3}$) at the N+/N non-rectifying junction with the drain layer 114 and a minimum concentration of $1\times10^{16}$ cm$^{-3}$ at a depth of 1 μm and continuing at a uniform level to the upper face. The base layer 116 may be formed by implanting P-type dopants such as boron into the drift layer 112 at an energy of 100 keV and at a dose level of $1 \times 10^{14}$ cm$^{-2}$, for example. The P-type dopants may then be diffused to a depth of 0.5 μm into the drift layer 112. An N-type dopant such as arsenic may then be implanted at an energy of 50 keV and at dose level of $1 \times 10^{15}$ cm$^{-2}$. The N-type and P-type dopants are then diffused simultaneously to a depth of 0.5 μm and 1.0 μm, respectively, to form a composite semiconductor substrate containing the drain, drift, base and source layers. As illustrated by FIG. 3A, the first conductivity type (e.g., N-type) doping concentration in the drift layer 112 is preferably less than about $5 \times 10^{16}$ cm$^{-3}$ at the P-N junction with the base layer 116 (i.e., second P-N junction), and more preferably only about $1 \times 10^{16}$ cm$^{-3}$ at the P-N junction with the base layer 116. The second conductivity type (e.g., P-type) doping concentration in the base layer 116 is also preferably greater than about $5 \times 10^{16}$ cm$^{-3}$ at the P-N junction with the source layer 118 (i.e., first P-N junction). Furthermore, according to a preferred aspect of the present invention, the second conductivity type doping concentration in the base layer 116 at the first P-N junction (e.g., $1 \times 10^{17}$ cm$^{-3}$) is about ten times greater than the first conductivity type doping concentration in the drift region at the second P-N junction (e.g., $1 \times 10^{16}$ cm$^{-3}$).

Figure 2:
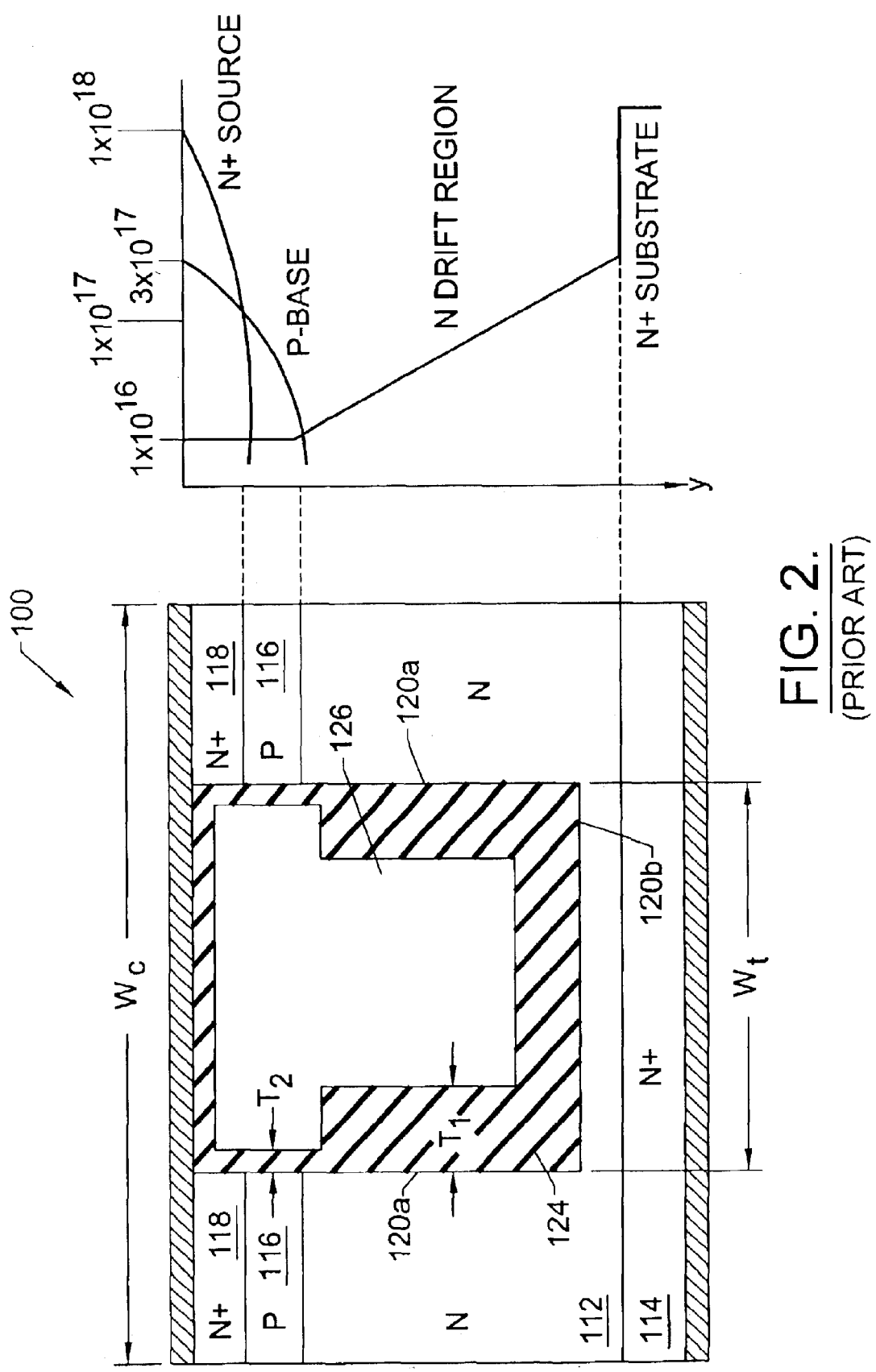
FIG. 2 is a cross-sectional view of another prior art power semiconductor device and doping profile therein.

A stripe-shaped trench having a pair of opposing sidewalls 120a that extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. A gate electrode/source electrode insulating region 125, a gate electrode 127 (e.g., polysilicon) and a trench-based source electrode 128a (e.g., polysilicon) are also formed in the trench. Because the gate electrode 127 is made relatively small and does not occupy the entire trench, the amount of gate charge required to drive the unit cell 200 during switching is much smaller than the amount of gate charge required to drive the unit cell 100 of FIG. 2 (assuming all other parameters and dimensions are equal), as described more fully hereinbelow. As will be understood by those skilled in the art, the trench may also be formed as a cylindrical or annular-shaped trench which when viewed in transverse-cross section appears as a trench having opposing sidewalls.

Here, the trench-based source electrode 128a is electrically connected to the source electrode 128b in a third dimension (not shown). In particular, because the source electrode 128b typically covers a top surface of the active device area, the contacts between the source electrode 128b and the trench-based source electrode 128 are typically made at the ends of the stripe-shaped trench. The portion of the gate electrode/source electrode insulating region 125 extending adjacent the trench bottom 120b and the drift layer 112 may also have a thickness "$T_1$" in a range between about 1500 Å and 3000 Å, for example, to inhibit the occurrence of high electric field crowding at the bottom corners of the trench and to provide a substantially uniform potential gradient along the trench sidewalls 120a. However, the portion of the gate electrode/source electrode insulating region 125 extending opposite the base layer 116 and the source layer 118 preferably has a thickness "$T_2$" of less than about 750 Å, and more preferably about 500 Å to maintain the threshold voltage of the device at about 2–3 volts. The use of tapered trench-based insulating regions to improve electric field profiles in highly doped drift region mesas is also described in U.S. application Ser. No. 09/322,424, to B. Jayant Baliga, entitled "Power Semiconductor Devices That Utilize Tapered Trench-Based Insulating Regions to improve Electric Field Profiles in Highly Doped Drift Region Mesas and Methods of Forming Same", filed May 28, 1999, now U.S. Pat. No. 6,191,447, the disclosure of which is hereby incorporated herein by reference. In particular, these tapered trench-based insulating regions are most preferably designed to have a nonuniform thickness $T_{ins}(y)$ in a range between about 0.5 and 1.5 times $T_{ideal}(Y)$ where $T_{ideal}(y)|_{y \leq \alpha} = \epsilon_{ins}((2\epsilon_s E_{cr}/qW_m N_d)(y-\alpha)+\frac{1}{4}W_m)/\epsilon_s$ and $\epsilon_{ins}$ is the permittivity of the electrically insulating region, $\epsilon_s$ is the permittivity of the drift region, $E_{cr}$ is the breakdown electric field strength of the drift region, q is the electron charge, $N_d$ is the first conductivity type doping concentration in the drift region, $W_m$ is a width of the mesa, y is the depth, relative to a top of the first trench, at which the thickness of the electrically insulating region is being determined and α is a non-negative constant. The constant α may equal zero in the event the power device is a Schottky rectifier and may equal the depth of the P-base region/N-drift region junction in the event the power device is a vertical MOSFET, for example.

Numerical simulations of the unit cell 200 of FIG. 3A were performed using a drift region doping concentration that increases from a value of $1 \times 10^{16}$ cm$^{-3}$ at a depth of 1 micron to a value of $2 \times 10^{17}$ cm$^{-3}$ at a trench depth ($T_D$) of 5 microns. The thin portion of the gate/source electrode insulating region 125 extended to 1.2 microns of a total trench depth of 4.7 microns and had a thickness of 500 Å. The thick portion of the gate/source electrode insulating region 125 had a thickness of 3000 Å. The N+ source layer 118 depth was set to 0.3 microns, and the depth of the P-type base region 116 was set to 0.9 microns. A half-cell width of 1 micron was used based on 1 micron design rules. The polysilicon gate electrode 127 extended to 1.2 microns and the polysilicon source electrode 128a extended from 1.5 microns to 4.4 microns. Based on these parameters, the specific on-resistance ($R_{on,sp}$) at a gate bias of 15 volts was found to be 114 microOhm cm$^2$ and the device blocked more than 60 volts. Comparisons of the potential distributions and contours in the device of FIG. 3A at a drain bias of 60 volts, against the device of FIG. 2, indicated essentially no change in the electric field profile within the drift region. This finding suggests that the trench-based source electrode 128a does not upset the degree of charge coupling and field distribution required to obtain high performance operation. Moreover, even though the specific on resistance of the device of FIG. 3A was about 20% greater than the specific on-resistance of the device of FIG. 2, the high frequency figure-of-merit (HFOM), defined as $(R_{on,sp}(Q_{GS}+Q_{GD}))^{-1}$, where $Q_{GS}$ and $Q_{GD}$ represent the gate-source and gate-drain charge per unit area, was also calculated to be three (3) times better than the HFOM for the device of FIG. 2. This result means the device of FIG. 3A is very suitable for high frequency operation.

Figure 3B:
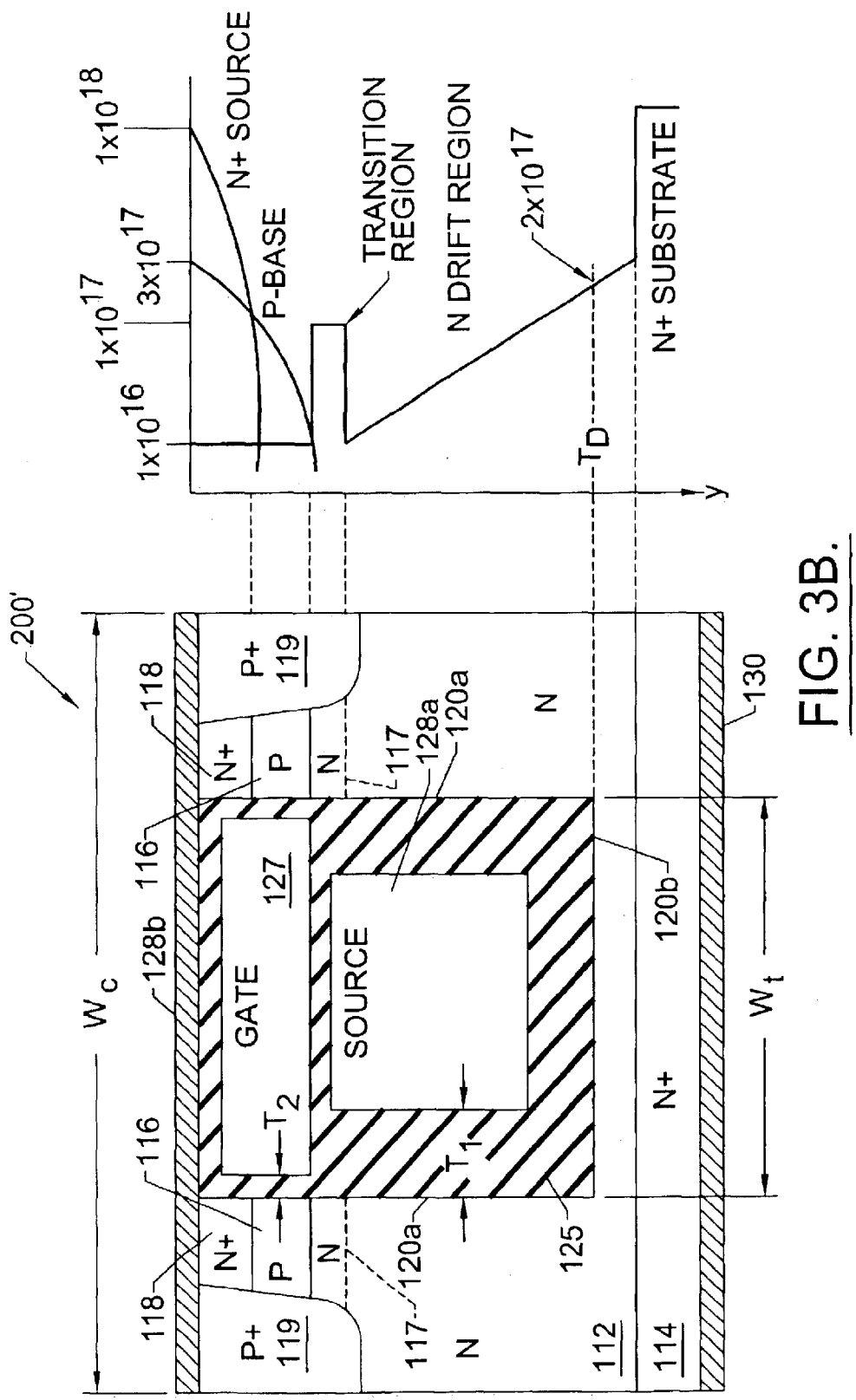
FIG. 3B is a cross-sectional view of a unit cell of an integrated power semiconductor device and doping profile therein, according to a second embodiment of the present invention.

Still further improvements in performance may be achieved by using a relatively highly doped transition region of first conductivity type that extends between the base layer 116 and the drift layer 112. The use of transition regions to improve device performance is more fully illustrated and described in U.S. application Ser. No. 09/602,414 to Baliga, entitled "MOSFET Devices Having Linear Transfer Characteristics When Operating in Velocity Saturation Mode," filed Jun. 23, 2000, the disclosure of which is hereby incorporated herein by reference. Highly doped shielding regions of second conductivity type may also be used to shield the base layer 116 by suppressing P-base reach-through effects when the unit cell 200 is blocking reverse voltages. The use of shielding regions to improve device performance is more fully illustrated and described in U.S. application Ser. No. 09/833,132 to Baliga, entitled "Power Semiconductor Devices Having Retrograded-Doped Transition Regions that Enhance Breakdown Voltage Characteristics and Methods of Forming Same," filed Apr. 11, 2001, the disclosure of which is hereby incorporated herein by reference. FIG. 3B herein is a reproduction of FIG. 3 from the aforementioned '414 application. The use of highly doped shielding regions and additional structures and packaging techniques that improve high frequency switching performance are also illustrated and described in U.S. application Ser. No. 09/993,412, to Baliga, entitled "Radio Frequency (RF) Power Devices Having Faraday Shield Layers Therein," filed Nov. 5, 2001, the disclosure of which is hereby incorporated herein by reference.

Referring now to FIG. 3B, a UMOSFET according to a second embodiment of the present invention will be described. In particular, a unit cell 200' of an integrated UMOSFET has a predetermined width "$W_c$" (e.g., 1 $\mu$m) and comprises a highly doped drain contact layer 114 of first conductivity type (e.g., N+), a drift layer 112 of first conductivity type having a linearly graded doping profile therein and a transition region 117 of first conductivity type which may have a relatively high N-type doping concentration therein of about $1\times10^{17}$ cm$^{-3}$. As illustrated by FIG. 3B, the transition region 117 forms a non-rectifying junction with the drift layer 112 and the N-type doping concentration in the transition region 117 is higher than the N-type doping concentration in a portion of the N-type drift layer 112 that extends to the non-rectifying junction with the transition region 117.

A relatively thin base layer 116 of second conductivity type (e.g., P-type) is also provided on the transition region 117 and forms a P-N rectifying junction therewith. This base layer 116 may have a thickness of about 0.2 $\mu$m. A highly doped source layer 118 of first conductivity type (e.g., N+) is also provided on the base layer 116, as illustrated. A source electrode 128*b* and drain electrode 130 may also be provided at the first and second faces, in ohmic contact with the source layer 118 and the drain contact layer 114, respectively. The source electrode 128*b* also preferably forms an ohmic contact with a P+ base region extension 119 that extends through the transition region 117. The P+ base region extension 119 may operate as a base shielding region by suppressing P-base reach-through effects.

The relatively highly doped transition region 117 is provided between the base layer 116 and the drift layer 112 in order to improve performance by enabling an inversion-layer channel formed in the base layer 116 to be operated in a linear mode (without channel pinch-off or velocity saturation) while the drift region is simultaneously operated in a velocity saturation mode.

The doping concentration in the transition region 117 is preferably set at a level sufficient to enable forward on-state conduction through the inversion-layer channel at low drain voltages and to maintain the channel in a linear mode of operation as the drain voltage is increased and exceeds the magnitude of a voltage applied to a gate electrode 127. This linear mode of operation is frequently referred to as a triode mode of operation. The design of the UMOSFET is such that the transition region 117 preferably becomes fully depleted at a point when the voltage at the drain-side of the channel $V_{cd}$ (i.e., at the end adjacent to the transition region 117) is $0 \leq V_{cd} \leq V_{gs}$, where $V_{gs}$ designates the gate-to-source voltage. For example, the UMOSFET of FIG. 3B may be designed so that the transition region 117 becomes fully depleted when $0.2 \leq V_{cd} \leq 0.5$ Volts and $V_{gs}=4.0$ Volts. To achieve full depletion, the P+ base region extension 119 is provided in close proximity to the transition region 117 (i.e., in the center of each mesa in a multi-celled device having a plurality of side-by-side trenches therein). Accordingly, as the voltage in the channel increases, the transition region 117 becomes more and more depleted until the transition region 117 is pinched off in manner similar to conventional operation of a JFET.

The drift layer 112 and transition region 117 may be formed by epitaxially growing an N-type in-situ doped monocrystalline silicon layer having a thickness of about 4 $\mu$m on an N-type drain contact layer 114 (e.g., N+ substrate) having a thickness of 100 $\mu$m and a first conductivity type doping concentration of greater than about $1\times10^{18}$ cm$^{-3}$ (e.g. $1\times10^{19}$ cm$^{-3}$) therein. As illustrated, the drift layer 112 may have a linearly graded doping profile therein with a maximum concentration of greater than about $5\times10^{16}$ cm$^{-3}$ (e.g., $3\times10^{17}$ cm$^{-3}$) at the N+/N non-rectifying junction with the drain contact layer 114 and a minimum concentration of about $1\times10^{16}$ cm$^{-3}$ at the junction with the transition region 117. The base layer 116 may be formed by implanting P-type dopants such as boron into the drift layer 112 at an energy of 100 kEV and at a dose level of $1\times10^{14}$ cm$^{-2}$, for example. The P-type dopants may then be diffused to a depth of 0.8 $\mu$m into the drift layer 112. An N-type dopant such as arsenic may then be implanted at an energy of 50 kEV and at dose level of $1\times10^{15}$ cm$^{-2}$. The N-type and P-type dopants are then diffused simultaneously to a depth of 0.5 $\mu$m and 1.0 $\mu$m, respectively. The second conductivity type (e.g., P-type) doping concentration in the base layer 116 is also preferably greater than about $5\times10^{16}$ cm$^{-3}$ at the P-N junction with the source layer 118 (i.e., first P-N junction). A selective implanting step may also be performed at a relatively high dose and high energy level to define the P+ base region extension 119.

A stripe-shaped trench having a pair of opposing sidewalls 120*a* which extend in a third dimension (not shown) and a bottom 120*b* is then formed in the substrate. For a unit cell 100 having a width $W_c$ of 1 $\mu$m, the trench is preferably formed to have a width "$W_t$" of 0.5 $\mu$m at the end of processing. A gate electrode/source electrode insulating region 125, a gate electrode 127 (e.g., polysilicon) and a trench-based source electrode 128*a* (e.g., polysilicon) are also formed in the trench. Because the gate electrode 127 is made relatively small and does not occupy the entire trench, the amount of gate charge required to drive the unit cell 200' during switching is much smaller than the amount of gate charge required to drive the unit cell 100 of FIG. 2 (assuming all other parameters and dimensions are equal).

Here, the trench-based source electrode 128*a* is electrically connected to the source electrode 128*b* in a third dimension (not shown). The portion of the gate electrode/source electrode insulating region 125 extending adjacent the trench bottom 120*b* and the drift layer 112 may also have a thickness "$T_1$" in a range between about 1500 Å and 5000 Å, for example, to inhibit the occurrence of high electric field crowding at the bottom corners of the trench and to provide a substantially uniform potential gradient along the trench sidewalls 120*a*. However, the portion of the gate electrode/source electrode insulating region 125 extending opposite the base layer 116 and the source layer 118 preferably has a thickness "$T_2$" of less than about 750 Å, and more preferably about 250 Å to maintain the threshold voltage of the device at about 2–3 volts.

Simulations of the device of FIG. 3B were also performed for a unit cell having a half-cell pitch of 1 $\mu$m with a half-mesa width of 0.5 μm. The thickness $T_2$ was set to 250 Å and the thickness of the base layer 116 was set to 0.2 μm with a peak doping concentration of $2\times10^{17}$ cm$^{-3}$. The gate electrode 127 extended to a depth of 0.6 μm and the trench depth was set to 4.7 μm. The thickness $T_1$ was also set to 3000 Å. The doping concentrations in the transition region 117 and drift layer 112 follow the profile illustrated by FIG. 3B. Based on these characteristics, excellent current saturation characteristics were observed with uniform spacing between the $I_d$ v. $V_d$ curves (at gate biases ranging from 2 to 4 volts). Highly linear $I_d$ v. $V_g$ transfer characteristics for gate biases in the range from 2 to 4 volts were also observed.

Referring now to FIGS. 4A–4K, a preferred method of forming the integrated power semiconductor device of FIG. 3A will be described. As illustrated best by FIG. 4A, the method begins with the step of forming a semiconductor substrate 10 by epitaxially growing a drift region 12 of first conductivity type (e.g., N-type) on a highly doped drain region 14 of first conductivity type that has a doping concentration greater than $1\times10^{18}$ cm$^{-3}$ therein. Computer controlled in-situ doping of the drift region 12 is also preferably performed during the epitaxial growth step so that the drift region 12 has a linearly graded (or step graded) first conductivity type doping concentration therein that decreases in a direction away from the drain region 14. In particular, the drift region 12 is preferably doped so that the doping concentration of the drift region 12 at the abrupt non-rectifying junction (J3) is greater than about $1\times10^{17}$ cm$^{-3}$ and more preferably about $3\times10^{17}$ cm$^{-3}$, but less than $5\times10^{16}$ cm$^{-3}$ at the first face 15a and more preferably only about $1\times10^{16}$ cm$^{-3}$ at the first face 15a.

Figure 4A:
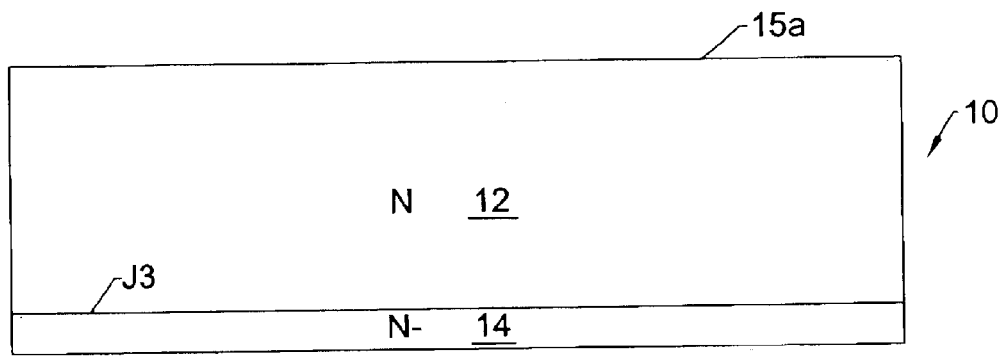
FIGS. 4A–4K are cross-sectional views of intermediate structures that illustrate preferred methods of forming the integrated power semiconductor device of FIG. 3A.
Figure 4B:
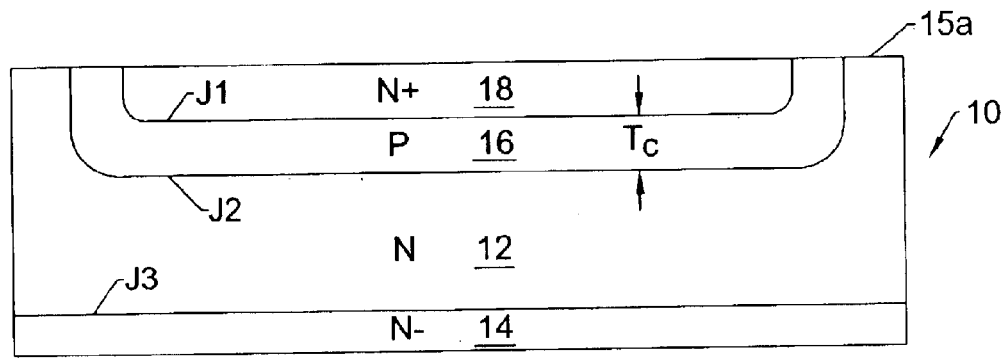

Referring now to FIG. 4B, a thin base region 16 is then formed in the substrate 10 by patterning a first implant mask (not shown) on the first face 15a having an opening therein that exposes an active portion of the substrate 10. Second conductivity type dopants are then implanted through the opening in the first mask. The implanted second conductivity type dopants can then be diffused into the drift region 12 to an initial depth of about 0.5 μm, for example. These steps are then preferably followed by the steps of patterning a second implant mask (not shown) on the first face 15a and performing an implant of first conductivity type source region dopants through the second mask. The second mask is also preferably patterned in a third dimension (not shown) so that portions of the underlying base region 16 do not receive the implanted source region dopants. These portions of the base region 16 that extend to the first face 15a can be ohmically contacted by a source electrode at the end of processing. The implanted first conductivity type dopants and the second conductivity type dopants can then be diffused to a depth of about 0.5 μm and 1.0 μm, respectively, to provide a base region thickness "$T_c$" of about 0.5 μm. Preferably, boron (B) is used as a P-type dopant and is implanted at a dose level of about $1\times10^{14}$ cm$^{-2}$ and at an energy of 100 keV. Arsenic (As) is preferably used as an N-type dopant and is implanted at a dose level of about $1\times10^{15}$ cm$^{-2}$ and at an energy of 50 KeV.

As will be understood by those skilled in the art, the implant and diffusion steps will cause the doping profile of the second conductivity type dopants in the substrate 10 to be generally gaussian in shape and have a maximum value at the first face 15a. The doping concentration in the base region 16 will also have a maximum value adjacent the source region 18 and a minimum value adjacent the drift region 12. In particular, the implant and diffusion steps may be performed so that the first conductivity type dopant concentration of the source region 18 at the first face 15a is greater than $1\times10^{18}$ cm$^{-3}$ and the second conductivity type dopant concentration in the base region 16 is greater than about $1\times10^{17}$ cm$^{-3}$ at a first P-N junction (J1) with the source region 18, but less than about $5\times10^{16}$ cm$^{-3}$ and more preferably only about $1\times10^{16}$ cm$^{-3}$ at the second P-N junction (J2) with the drift region 12. To meet these criteria, the first conductivity type doping concentration in the drift region 12 should be about $1\times10^{16}$ cm$^{-3}$ at the second P-N junction (J2). Because of this relatively low value of $1\times10^{16}$ cm$^{-3}$ in the drift region 12, the base region 16 can be made thin (e.g., 0.5 μm) without being susceptible to parasitic reach-through breakdown and can be doped relatively low to maintain the transistor's threshold voltage at about 2–3 volts.

Figure 4C:
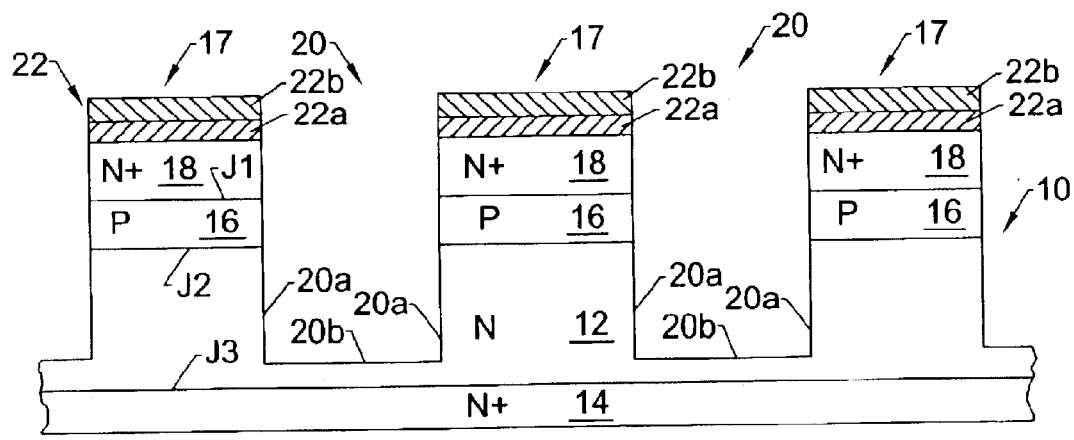

Referring now to FIG. 4C, an etching mask 22 including a stress relief oxide layer 22a and an oxidation barrier layer 22b (e.g., $Si_3N_4$) is then patterned on the first face 15a to define openings that expose adjacent portions of the first face extending over the source and base regions 18 and 16. The source, base and drift regions are then chemically etched to form a plurality of trenches 20. As illustrated, each of the trenches has opposing vertical sidewalls 20a that define interfaces between the source, base and drift regions and an interior of the trench, and a trench bottom 20b in the drift region. Facing sidewalls 20a of adjacent trenches also define respective mesas 17 that may have uniform widths of about 0.5 μm at the end of processing. The trenches 20 and mesas 17, which extend in a third dimension, not shown, can be of stripe or similar geometry. The mesas 17 can also be polygonal (e.g., hexagonal) in shaped with the trenches 20 defining a continuous mesh when viewed from a direction normal to the face 15a. As explained more fully hereinbelow, the widths of the mesas 17 can be selected to improve the blocking voltage capability of the transistor. In particular, the width of the mesas 17 (at the end of processing) and the doping concentration in the drift region 12 at J3 should be selected so that their product is within the range of $1\times10^{13}$–$2\times10^{13}$ cm$^{-2}$ to obtain a preferred charge concentration in the drift region 12. In addition, the width of the mesas 17 and the doping concentration in the drift region 12 at J2 should be selected so that their product is within the range of $1\times10^{11}$–$2\times10^{12}$ cm$^{-2}$.

Figure 4D:
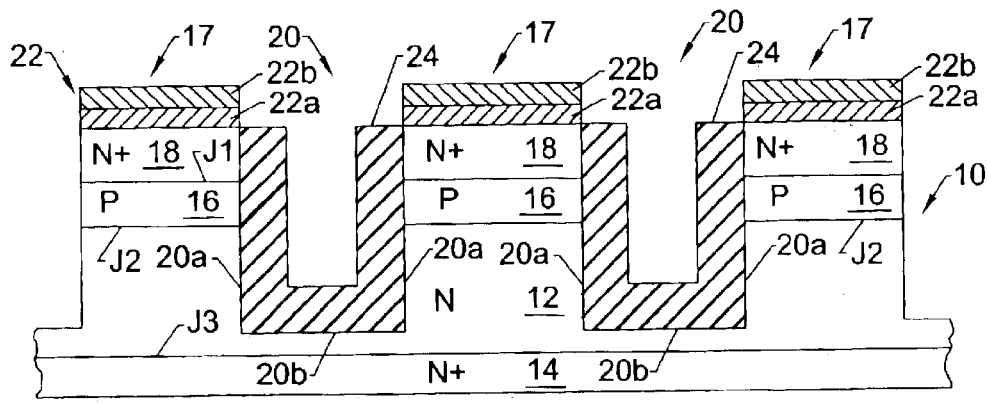
Figure 4E:
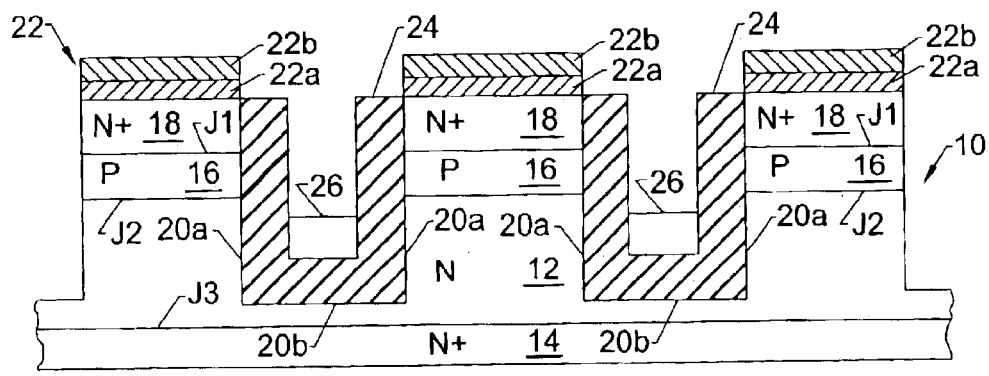
Figure 4F:
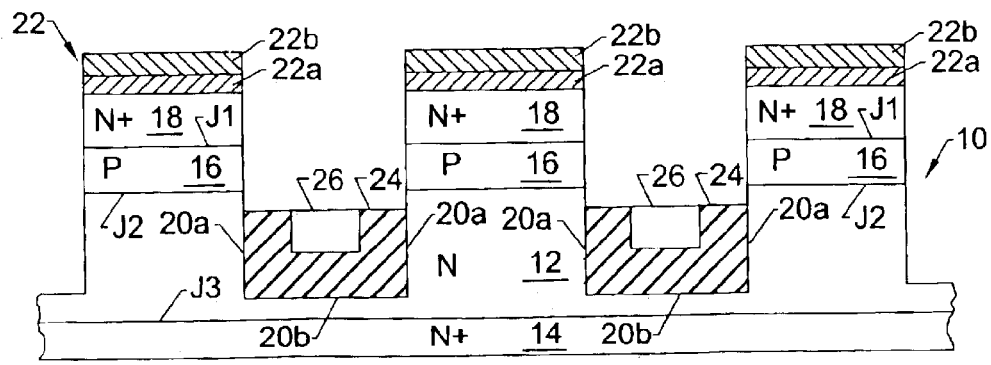

Referring now to FIG. 4D, which illustrates a cross-section of three adjacent mesas 17, the method continues with the formation of a first electrically insulating region 24 (e.g., $SiO_2$) having a first thickness greater than 1000 Å and more preferably about 3000 Å, on the trench sidewalls 20a and the trench bottom 20b of each trench 20. This step is preferably performed by oxidizing the etched source, base and drift regions, using the oxidation barrier layer 22b as an oxidation mask. As will be understood by those skilled in the art, the growth of an oxide having a thickness of about 3000 Å will typically consume about 0.1 μm or more of semiconductor material. Accordingly, the initial widths of the mesas 17 should be selected so that at the end of processing the widths are at the desired value of about 0.5 μm.

Figure 4G:
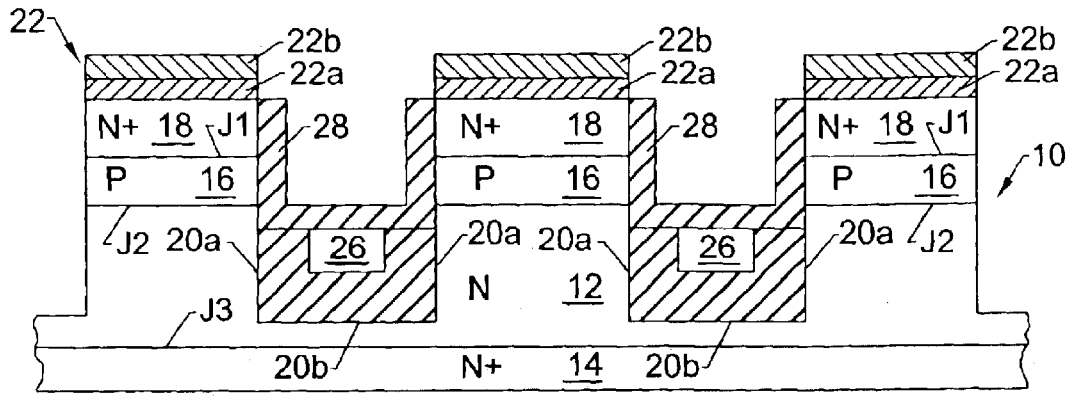
Figure 4H:
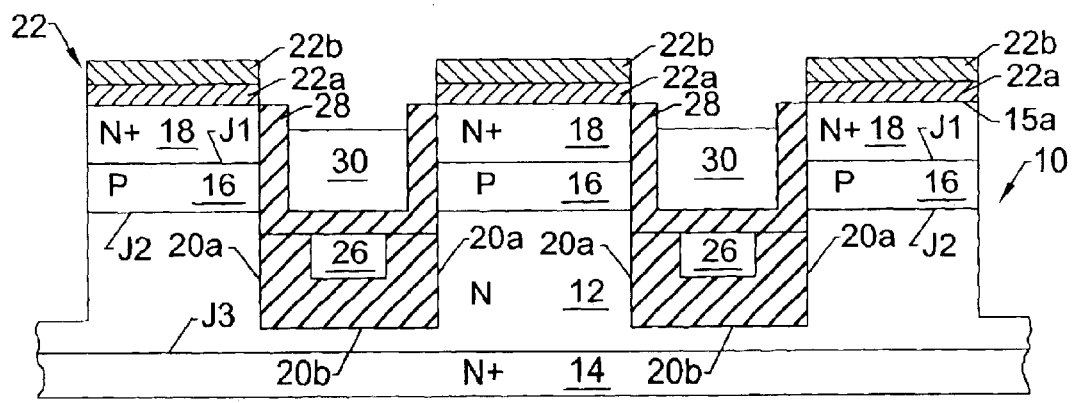

Referring now to FIGS. 4E–4K, a conformal N-type first polycrystalline silicon region 26 is then deposited and etched until it is recessed in the trench to a depth just below the second P-N junction (J2). This first polysilicon region 26 defines a trench-based source electrode. An oxide etching step is then performed to remove the first electrically insulating region 24 from the portions of the sidewalls 20a that extend adjacent the etched source and base regions 18 and 16, as illustrated best by FIG. 4F. Referring now to FIG. 4G, a second electrically insulating region 28 (e.g., $SiO_2$) having a second thickness less than about 1000 Å and more preferably about 500 Å, is then formed on the exposed trench sidewalls 20a and on the polysilicon region 26. Referring now to FIG. 4H, a conformal second polycrystalline silicon region 30 is then deposited on the second electrically insulating region 28. The second polycrystalline silicon region 30 is then etched until it is recessed in the trench to a depth just below the first face 15a. Steps are also preferably performed to expose the first polysilicon region 26 in a third dimension (not shown) so that subsequent contact can be made to a source electrode on the face 15a.

Figure 4I:
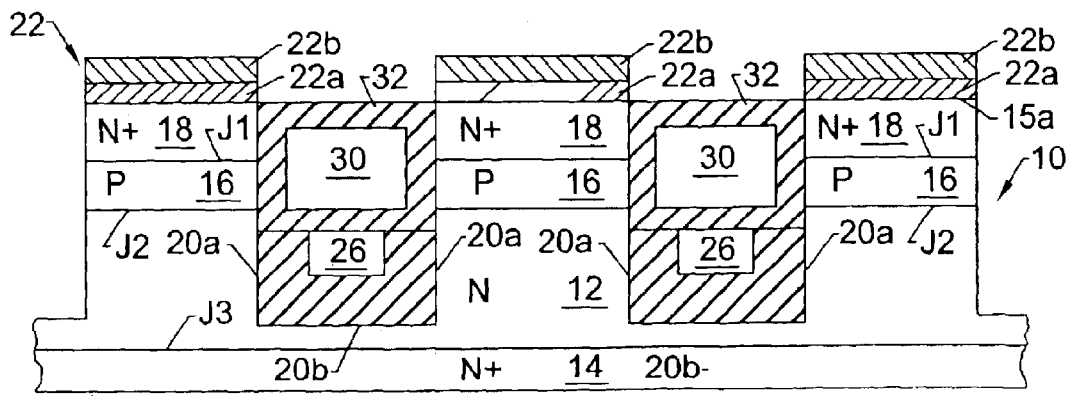
Figure 4J:
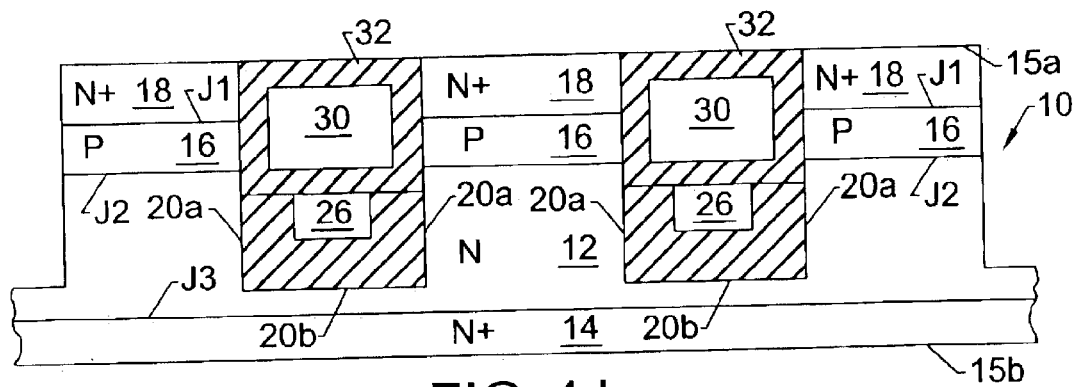
Figure 4K:
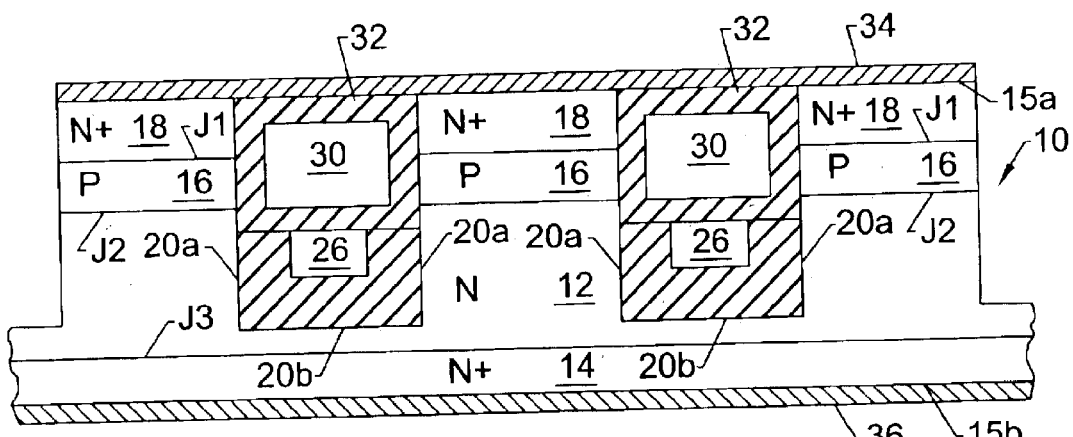

A third electrically insulating region 32 is then formed on the etched second polycrystalline silicon region 30 by oxidizing the second polycrystalline silicon region 30, as illustrated by FIG. 4I. The stress relief oxide layer 22a and the oxidation barrier layer 22b (e.g., $Si_3N_4$) are then etched to expose the source region 18 and base region 16 at the first face 15a, as illustrated by FIG. 4J. A source metal contact layer 34 is then deposited on the first face 15a and a drain metal contact layer 36 is deposited on an opposing second face 15b to form ohmic contacts to the source, base and first polysilicon regions (18, 16 and 26) and drain region 14, respectively, as illustrated by FIG. 4K.

Figure 5:
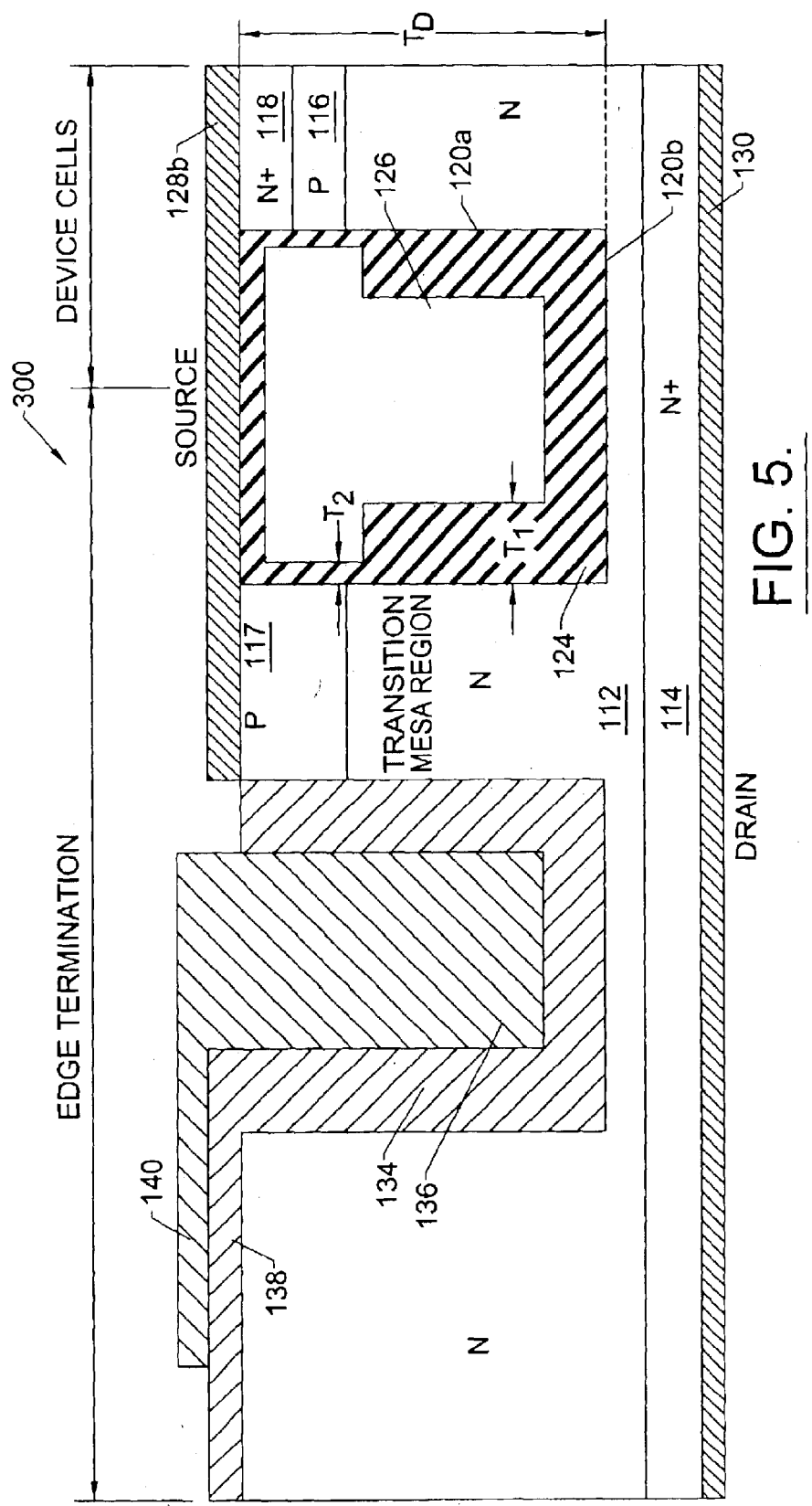
FIG. 5 is a cross-sectional view of an integrated power semiconductor device according to a third embodiment of the present invention.

Referring now to FIG. 5, an integrated power semiconductor device 300 according to a third embodiment of the present invention will be described. As illustrated, this power device 300 includes an active device region and an edge termination region that may extend adjacent an outermost edge of a semiconductor substrate containing the power device 300. According to one aspect of this embodiment, the active device region may include a plurality of unit cells that are similar to the unit cells 100 and 200 of FIGS. 2 and 3, respectively. However, to improve edge termination characteristics, an edge termination trench is provided in the edge termination region and a uniformly thick first field plate insulating region 134 is provided that lines the sidewalls and bottom of the edge termination trench. A field plate 136, comprising a material such as N-type polysilicon, is also provided on the first field plate insulating region 134. In addition, a second field plate insulating region 138 is provided on the first face and this second field plate insulating region overlaps the first field plate insulating region 134. To complete the field plate structure, a field plate extension 140 is provided. This field plate extension 140, which is electrically connected to the field plate 136, is provided on the second field plate insulating region 138 and extends opposite the face of the substrate, as illustrated. This field plate extension 140 may also comprise N-type polysilicon. The field plate 136 is also preferably connected to the source electrode 128b or gate electrode 126.

Figure 6:
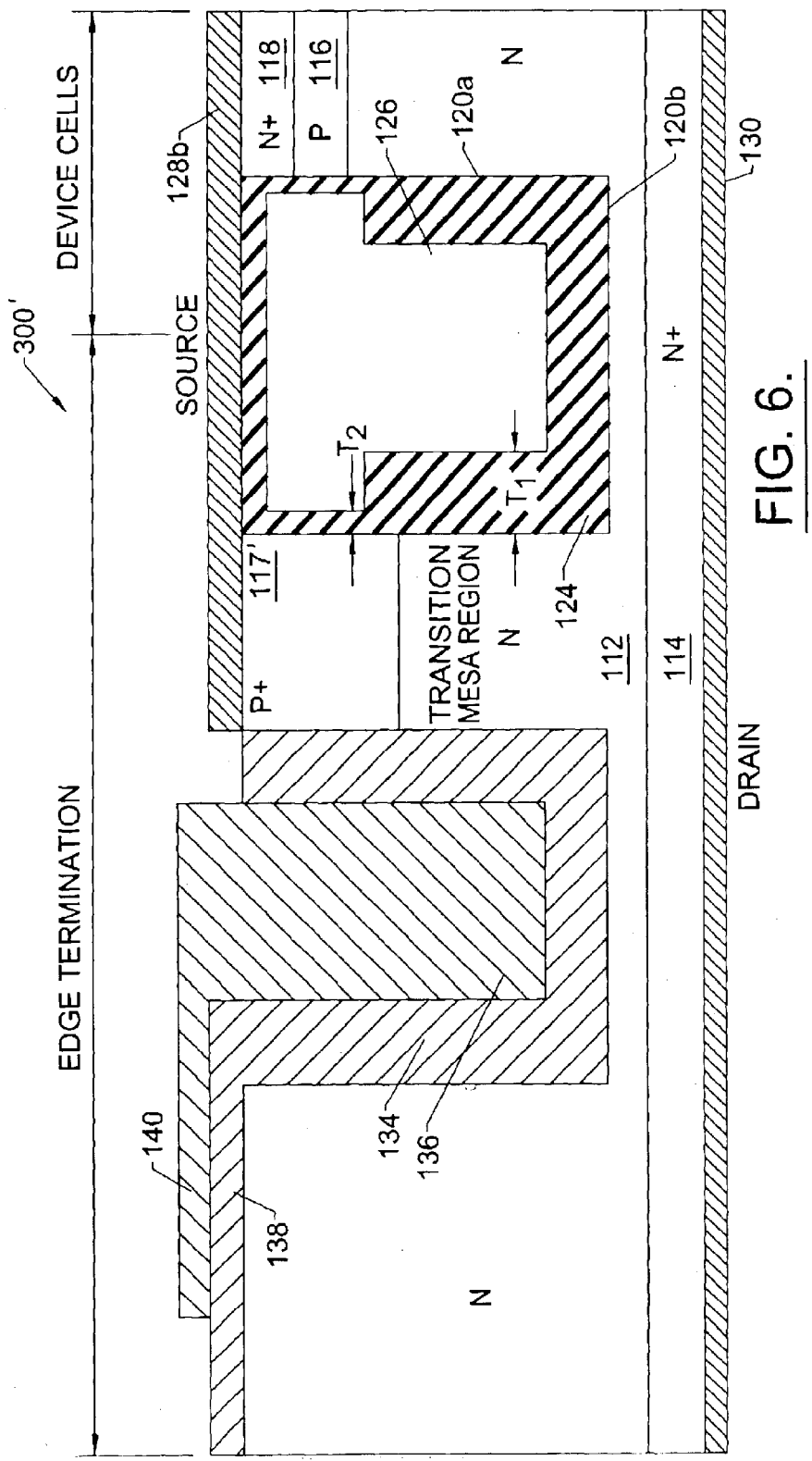
FIG. 6 is a cross-sectional view of an integrated power semiconductor device according to a fourth embodiment of the present invention.

To improve the edge termination and breakdown characteristics of the integrated power device 300 even further, the edge termination trench is preferably positioned so that a transition mesa region is defined between opposing sidewalls of the edge termination trench and the trench corresponding to the outermost unit cell of the device 300. However, unlike the mesa regions that are defined between trenches within the active device region of the integrated power device 300, the transition mesa region is preferably formed to be devoid of a source region of first conductivity type. Instead, a preferred breakdown shielding region 117 of second conductivity type (e.g., P-type) is provided. The breakdown shielding region 117 may be formed at the same time the base region 116 is formed, for example. However, as illustrated best by FIG. 6, which is a cross-sectional view of an integrated power semiconductor device 300' according to a fourth embodiment of the present invention, the breakdown shielding region 117' may also be formed deeper (and more highly doped) than the base region 116 to further increase the likelihood that avalanche breakdown will occur in the transition mesa region instead of within the active region. The use of breakdown shielding regions to improve the breakdown characteristics of power semiconductor devices is also described in commonly assigned U.S. application Ser. No. 09/167,298, filed Oct. 6, 1998, entitled "Rugged Schottky Barrier Rectifiers Having Improved Avalanche Breakdown Characteristics", the disclosure of which is hereby incorporated herein by reference. It is preferred that the depth of the breakdown shielding regions be less than about 0.5 times the depth of the trenches.

Numerical simulations of the unit cell 300 of FIG. 5 were performed using a drift region doping concentration that increases from a value of $1 \times 10^{16}$ $cm^{-3}$ at a depth of 1 micron to a value of $2 \times 10^{17}$ $cm^{-3}$ at a trench depth ($T_D$) of 5 microns. The thin portion of the gate electrode insulating region 124 had a thickness of 500 Å, the thick portion of the gate electrode insulating region 124 had a thickness of 3000 Å and the first field plate insulating region 134 had a uniform thickness of 3000 Å. Based on these parameters, the simulated potential contours were shown to be uniformly spaced in both the active and termination regions. The simulated current flowlines also indicated that breakdown would occur simultaneously in both the active and termination regions so long as the breakdown shielding region 117 is electrically connected to the source electrode 128b. Accordingly, breakdown in the integrated power device 300 of FIG. 5 is not expected to be edge limited. Moreover, in applications where the GD-MOSFET unit cells in the active region are expected to be frequently driven into avalanche breakdown, it is preferable to move the location of avalanche breakdown to the more highly doped and deeper breakdown shielding region 117' within the device 300' of FIG. 6. In particular, by increasing the depth of the breakdown shielding region 117', the breakdown voltage can be decreased to a level that will provide sufficient protection to the unit cells in the active device area and improve the lifetime and reliability of the overall device 300'. In addition, as described more fully hereinbelow with respect to FIG. 7, the breakdown voltage and the specific on-resistance $R_{sp,on}$ can also be scaled downward by decreasing the epitaxial layer thickness of the drift region 112.

Figure 7:
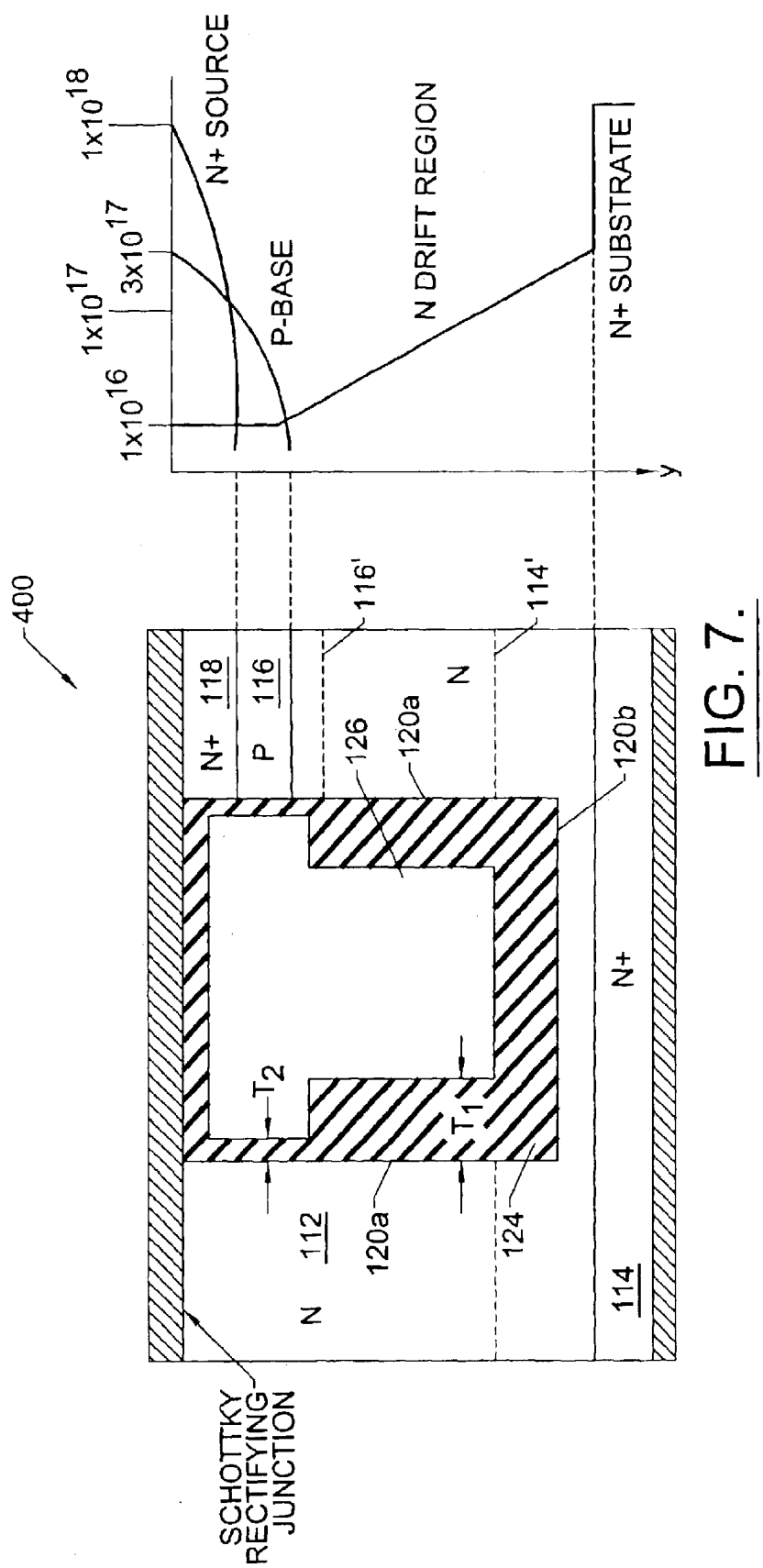
FIG. 7 is a cross-sectional view of an integrated power semiconductor device according to a fifth embodiment of the present invention.

Referring now to FIG. 7, an integrated power semiconductor device 400 according to a fifth embodiment of the present invention will be described. As illustrated, this power device 400 is a hybrid device that may contain the GD-UMOSFET unit cells of FIGS. 2 and 3A–3B (having non-uniformly thick gate insulating regions therein) extending adjacent one sidewall of each trench in the active region and a modified TMBS Schottky rectifier (acting as a flyback diode) extending adjacent an opposing sidewall of each trench. In the modified TMBS Schottky rectifier illustrated on the left side of the unit cell of FIG. 7, preferred charge coupling is provided by a gate electrode within a trench having a non-uniformly thick gate insulating region therein, instead of an anode electrode and a uniformly thick insulating region. Moreover, whereas conventional TMBS rectifiers, such as those disclosed in U.S. Pat. No. 5,612,567 to Baliga, which is hereby incorporated herein by reference, include a linearly graded drift region doping concentration that extends all the way to the Schottky rectifying junction at the face, a uniformly doped region extends adjacent the Schottky rectifying junction in the modified TMBS rectifier of FIG. 7. As illustrated, this uniformly doped portion of the drift region has a doping concentration of $1 \times 10^{16}$ $cm^{-3}$ therein. The advantages of including a uniformly doped region adjacent the Schottky rectifying junction in a TMBS device are more fully described in the aforementioned application entitled "Rugged Schottky Barrier Rectifiers Having Improved Avalanche Breakdown Characteristics".

This hybrid power device 400 is designed so that the GD-MOSFET unit cells have very low specific on-state resistance, the modified TMBS structure has very low leakage current and low on-state voltage drop and the combined hybrid structure exhibits very low parasitic inductance. In particular, simulations of the hybrid device of FIG. 7 illustrate that the on-state voltage drop of both the GD-MOSFET and modified TMBS are reduced because of improved current spreading in the N+ substrate region 114. The specific on-resistance $R_{sp,on}$ can also be scaled downward by decreasing the epitaxial layer thickness of the drift region 112. This reduction in epitaxial layer thickness causes the non-rectifying junction formed between the drift region 112 and the drain region 114' (illustrated by the dotted line in FIG. 7) to move up along the sidewalls of each trench, without any other modification in the process. Accordingly, the reduction in epitaxial layer thickness (or increase in trench depth) results in the formation of an interface between the bottom of the trench 120b and the drain region 114'. The simulations also indicate the possibility of higher temperature operation with smaller heat sinks because of an improvement in the leakage current characteristics. The hybrid device also limits the amount of parasitic inductance between the GD-MOSFET and modified TMBS rectifiers within each unit cell.

As further illustrated by FIG. 7, an increase in the depth of the base region 116 to the level illustrated by the dotted line 116' can also be used advantageously to suppress the degree of any impact ionization near the gate insulating region 124 that may arise in response to hot electron injection during avalanche breakdown. In particular, steps to form the gate insulating region so that there is an overlap between the thick portion of the gate insulating region 124 (extending upward from the bottom of the trench) and the base region 116 can be used to enhance the electric field contours at the corner of the gate between the thick and thin portions and thereby shield the gate insulating region from the effects of hot electron induced instabilities during avalanche breakdown. Accordingly, the gate insulating region 124 may have a first thickness (shown as $T_2$) of less than about 750 Å as measured between the gate electrode 126 and a first intersection between the first sidewall and the P-N junction formed between the source region 118 and P-base region 116. In addition, the gate insulating region 124 may have a second thickness (shown as $T_1$) of greater than about 1500 Å as measured between the gate electrode 126 and a second intersection between the first sidewall and the P-N junction formed between the P-base region 116 and the drift region 112. Moreover, because of the illustrated graded doping profile of the base region 116, which falls off near the base/drift region junction; it is still possible to form an inversion layer channel across the entire base region 116 even though the gate oxide thickness is relatively large (e.g., 3000 Å) at the drain side of the base region 116. Designing the unit cell to provide this gate shielding advantage may, however, result in some increase in the specific on-state resistance of the device.

Referring now to FIGS. 8 and 9A–9H, a preferred vertical MOSFET 500 according to another embodiment of the present invention includes a semiconductor substrate having a plurality of semiconductor mesas 504a therein that are separated by a plurality of deep stripe-shaped trenches that extend in parallel and lengthwise across the substrate in a first direction. A plurality of buried insulated source electrodes 516 are provided in the plurality of stripe-shaped trenches. A plurality of insulated gate electrodes 520 are also provided. The gate electrodes 520 extend in parallel across the plurality of semiconductor mesas 504a and into shallow trenches defined in the plurality of buried insulated source electrodes 516. A surface source electrode 524 is also provided. The surface source electrode 524 extends on the semiconductor mesas 504a and is electrically connected to the plurality of buried insulated source electrodes 516. The insulated gate electrodes 520 are preferably stripe-shaped electrodes that extend lengthwise across the mesas 504a in a second direction orthogonal to the first direction.

Figure 8:
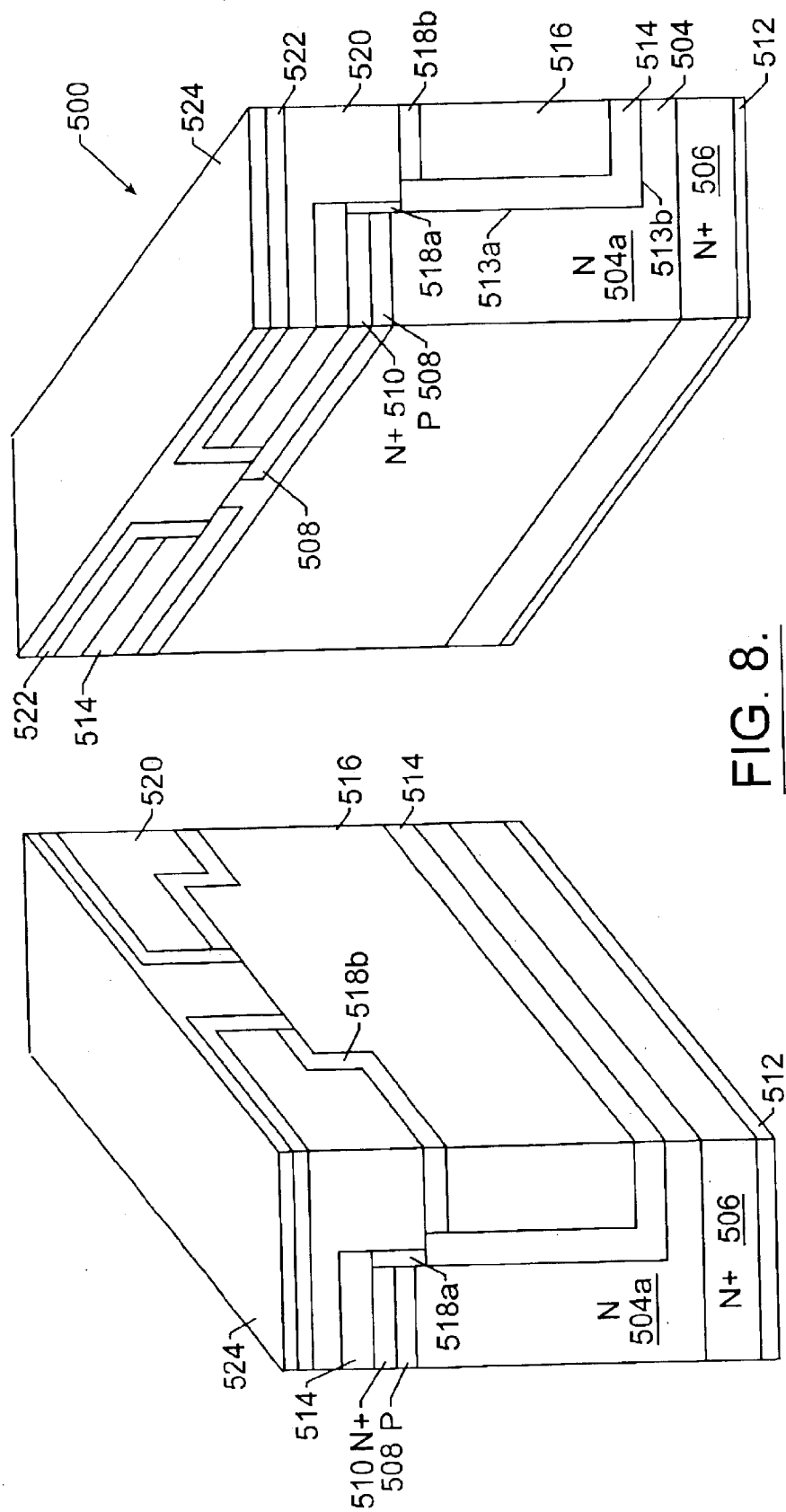
FIG. 8 is a perspective view of a vertical MOSFET according to another embodiment of the present invention.
Figure 9A:
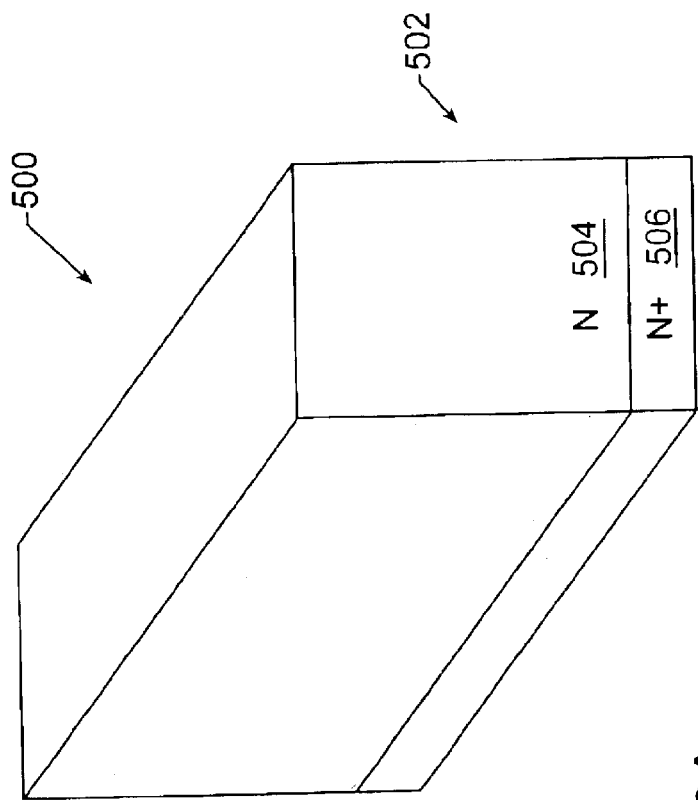
FIGS. 9A–9H are perspective views of intermediate structures that illustrate methods of forming vertical MOSFETs according to additional embodiments of the present invention.
Figure 9A:
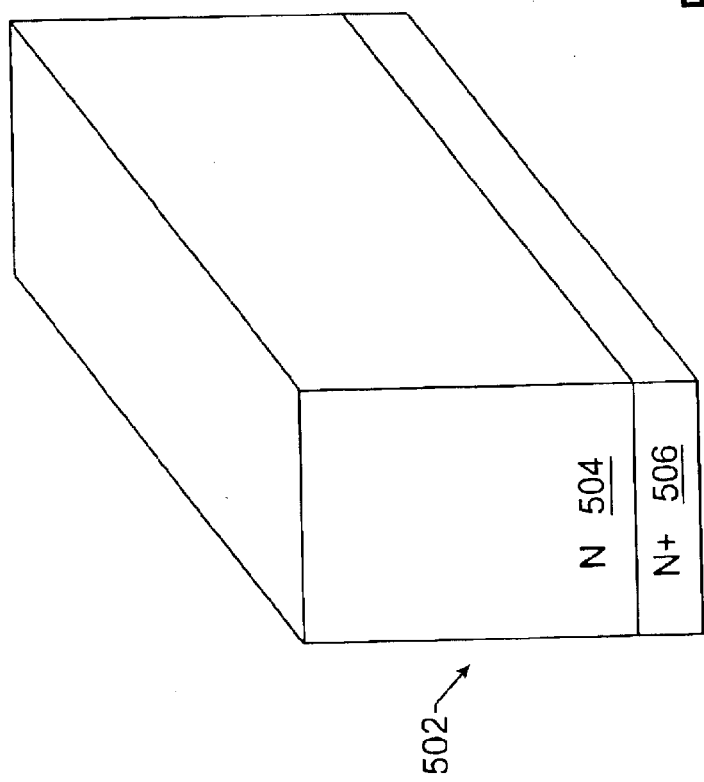

Preferred methods of forming the vertical MOSFET 500 of FIG. 8 are illustrated by FIGS. 9A–9H. In particular, each of FIGS. 9A–9H illustrates a right-side perspective view and a left-side perspective view of a half unit cell of a vertical MOSFET according to embodiments of the present invention, at intermediate stages of fabrication. As illustrated by FIG. 9A, a semiconductor substrate 502 is provided having a drift region 504 of first conductivity type therein (shown as N). This drift region 504 may have a uniform or nonuniform doping concentration profile therein. An exemplary nonuniform doping concentration profile that has a linearly graded region is illustrated on the right side of FIG. 3B. The drift region 504 may also include a transition region therein, as illustrated by FIG. 3B. Other doping concentration profiles may also be used. The semiconductor substrate 502 may have upper and lower opposing surfaces and a highly doped drain region 506 (shown as N+) may be provided adjacent the lower surface of the substrate 502. As will be understood by those skilled in the art, the semiconductor substrate 502 may be formed by epitaxially growing an in-situ doped drift region 504 on an upper surface of a highly doped semiconductor wafer that acts as the drain region 506.

Figure 9B:
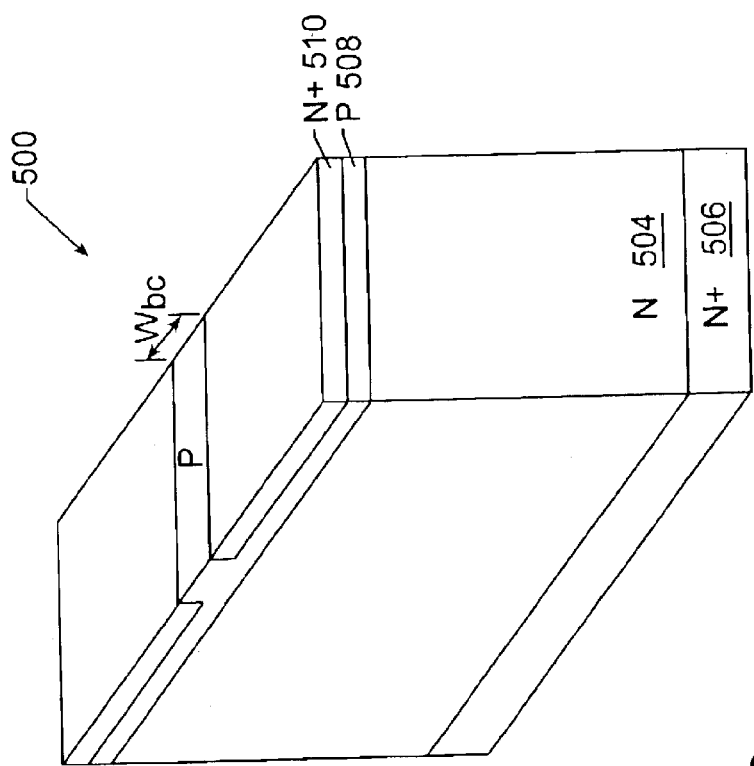
Figure 9B:
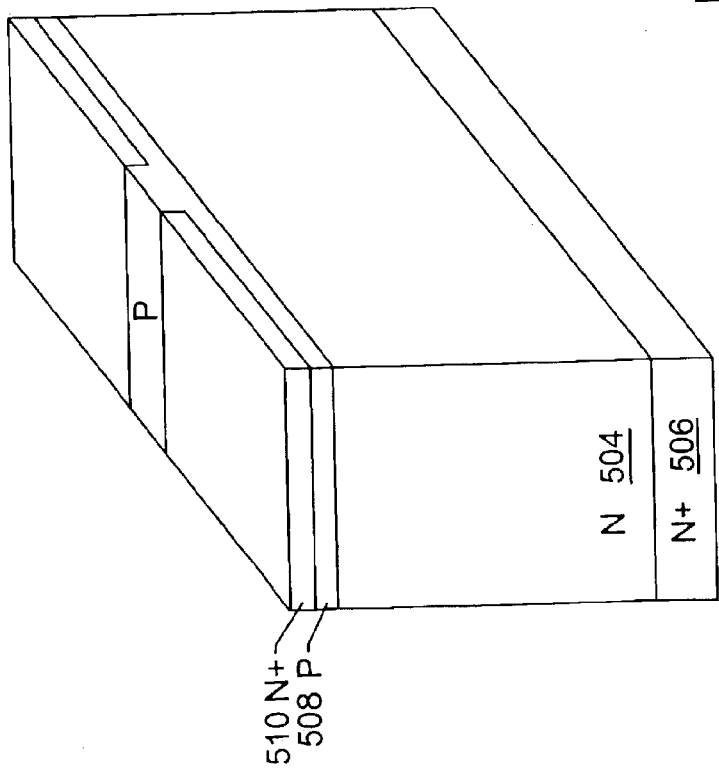

Referring now to FIG. 9B, a first mask (not shown) may be formed on the upper surface of the substrate 502. The first mask is preferably patterned to have a first opening therein that defines an active portion of the substrate 502. Base region dopants of second conductivity type are then implanted through the first opening and into the substrate 502. After the base region dopants have been implanted, a relatively short duration annealing step may be performed to partially drive-in the implanted base region dopants. Alternatively, the first mask may be patterned to define an inactive portion of the substrate 502 and then a step may be performed to thermally oxidize the inactive portion of the substrate 502 and define a field oxide isolation region thereon. The first mask may then be removed to expose the active portion of the substrate 502. The field oxide isolation region may then be used as a base region implant mask.

A second mask (not shown) may then be deposited on the active portion of the substrate 502. A plurality of openings are defined in the second mask, with each opening revealing a respective area on the active portion of the substrate 502 through which source region dopants of first conductivity type are implanted. The plurality of openings may comprise a plurality of rectangular openings, with the width of each opening extending in a first direction across the substrate 502 and the length of each opening extending in a second direction orthogonal to the first direction across the substrate 502. In FIGS. 9A–9H, the first direction may be front-to-back across the illustrated half unit cell and the second direction may be left-to-right.

Another annealing step may then be performed to simultaneously drive-in the implanted source region dopants and base region dopants to substantially their full and final depths Within the substrate 502. At the conclusion of this annealing step, a plurality of stripe-shaped source regions 510 may extend lengthwise in parallel in the second direction across a single base region 508. In order to suppress parasitic bipolar transistor action in the resulting vertical MOSFET, the width of each source region stripe 510 in the first direction should be less than about ten (10) microns. To maximize channel width, the spacing "$W_{bc}$" between adjacent source regions 510 in the first direction may be set at less than about one (1) micron.

Figure 9C:
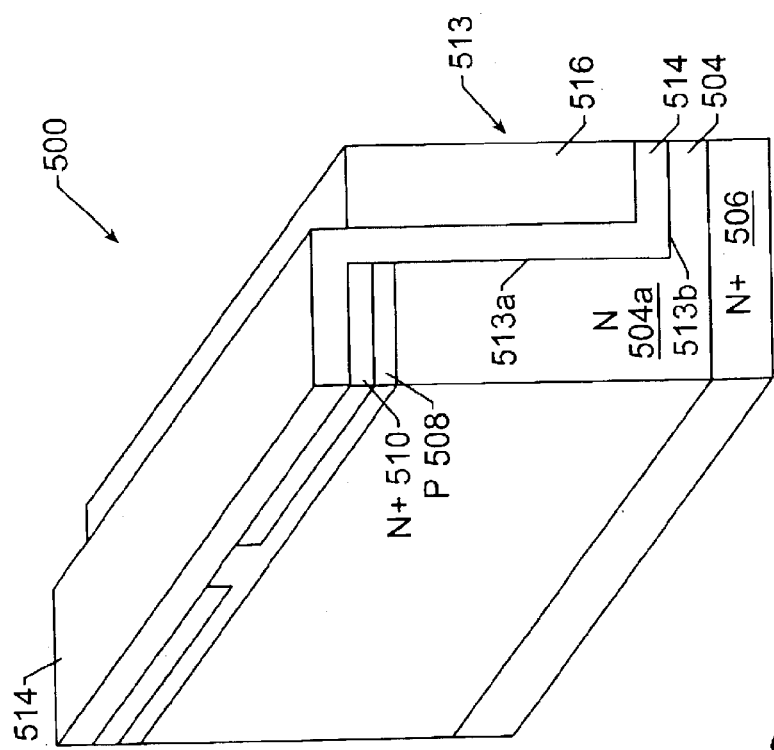
Figure 9C:
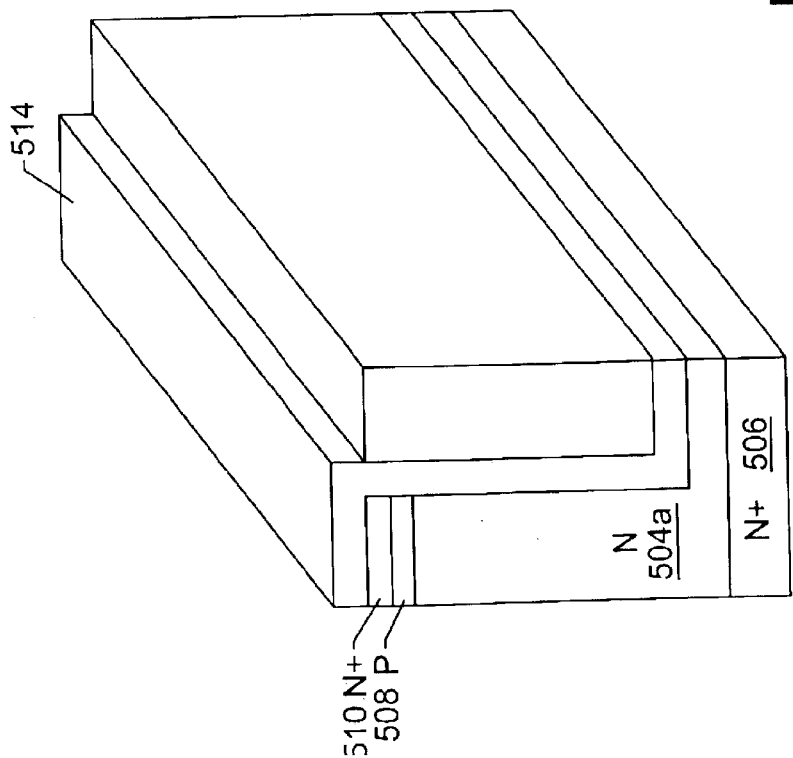

Referring now to FIG. 9C, a third mask (not shown) may then be formed on the active portion of the substrate 502. This third mask be patterned with spaced rectangular openings that extend lengthwise in the first direction. A selective etching step may then be performed using the third mask to define a plurality of deep stripe-shaped trenches 513 in the substrate 502, with each pair of adjacent deep trenches defining a drift region mesa 504a therebetween into which the drift region 504 extends. As illustrated, the deep stripe-shaped trenches 513 and drift region mesas 504a extend lengthwise in the first direction across the substrate 502. A blanket electrically insulating layer 514 is then conformally deposited on the substrate 502. As illustrated, the blanket electrically insulating layer 514 extends into each trench 513 and lines the sidewalls 513a and bottom 513b of each trench. This electrically insulating layer 514 may comprise silicon dioxide or other preferred dielectric insulating material. A blanket conductive layer (e.g., N+ polysilicon) may then be conformally deposited onto the substrate 502 and into the trenches 513. This conductive layer is then planarized (e.g., etched back) to define a plurality of trench-based source electrodes 516 that extend lengthwise in the first direction along the trenches 513. These trench-based source electrodes 516 are electrically insulated from the substrate 502 by the electrically insulating layers 514 that line the trenches 513, and therefore constitute a buried insulated source electrodes.

Figure 9D:
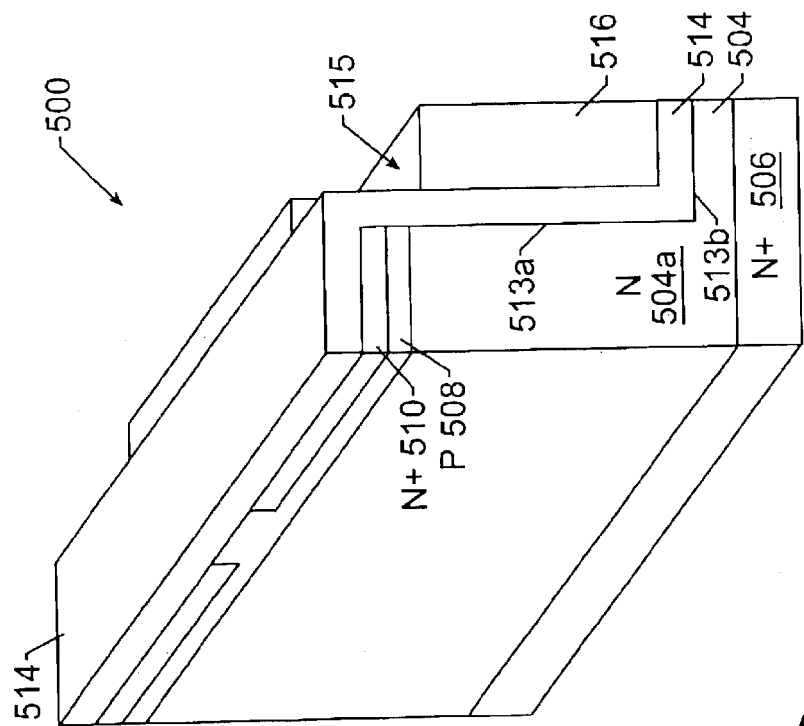
Figure 9D:
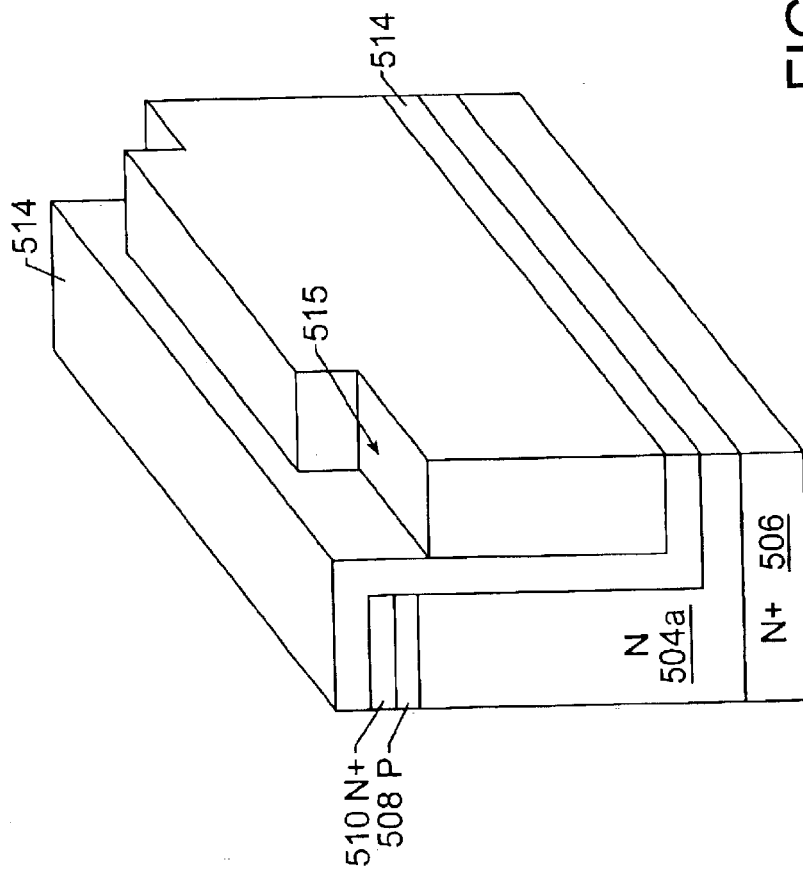
Figure 9E:
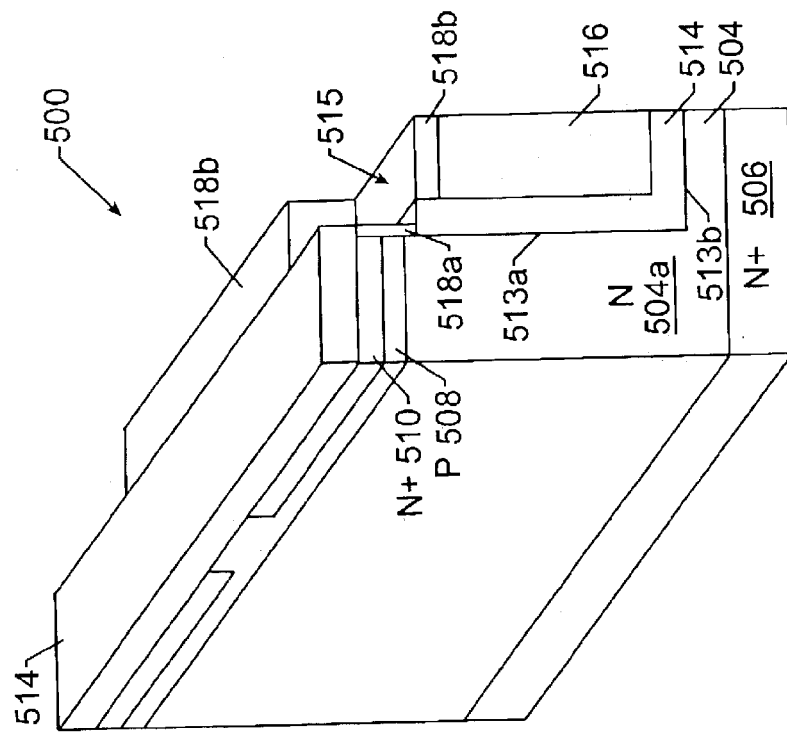
Figure 9E:
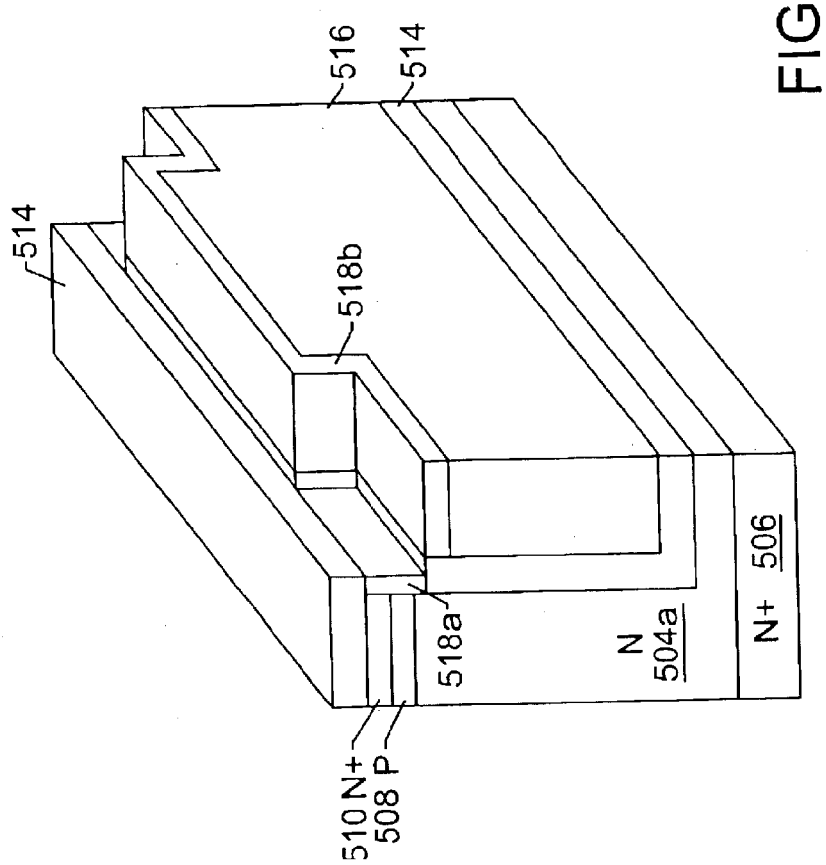

Referring now to FIG. 9D, a fourth mask (not shown) may then be deposited and patterned to provide a plurality of openings at spaced locations along the length of each trench 513. Another selective etching step may then be performed to define a plurality of shallow trenches 515 within each of the buried insulated source electrodes 516, using the fourth mask as an etching mask. As illustrated, the definition of these shallow trenches 515 exposes upper portions of the electrically insulating layers 514 that line the sidewalls 513a of the trenches 513. Another selective etching step may then be performed to remove the exposed upper portions of the electrically insulating layers 514. This selective etching step, which uses the trench-based source electrodes 516 as an etching mask, results in the exposure of portions of the source regions 510 and base region 508 that extend adjacent the exposed upper sidewalls 513a. As illustrated by FIG. 9E, a thermal oxidation step may then be performed to define a gate oxide layer 518a on the exposed base and source regions (at the exposed sidewalls 513a) and a gate-to-source insulating layer 518b along the bottom and sidewalls of each of the shallow trenches 515 within each buried insulated source electrode 516. Different material characteristics associated with the substrate, which typically comprises monocrystalline silicon, and the trench-based source electrode 516, which typically comprises polycrystalline silicon, may cause the gate-to-source insulating layer 518b to be substantially thicker than the gate oxide layer 518a. Although not absolutely necessary, the material characteristics of the trench-based source electrode 516 may be chosen so that the trench-based source electrode 516 thermally oxidizes at a higher rate than the substrate 502. For example, a thermal oxidation step that results in a gate oxide layer 518a having a thickness of about 40 nm (400 Å) may also result in gate-to-source insulating layer 518b having a thickness of about 500 nm (5000 Å).

Figure 9F:
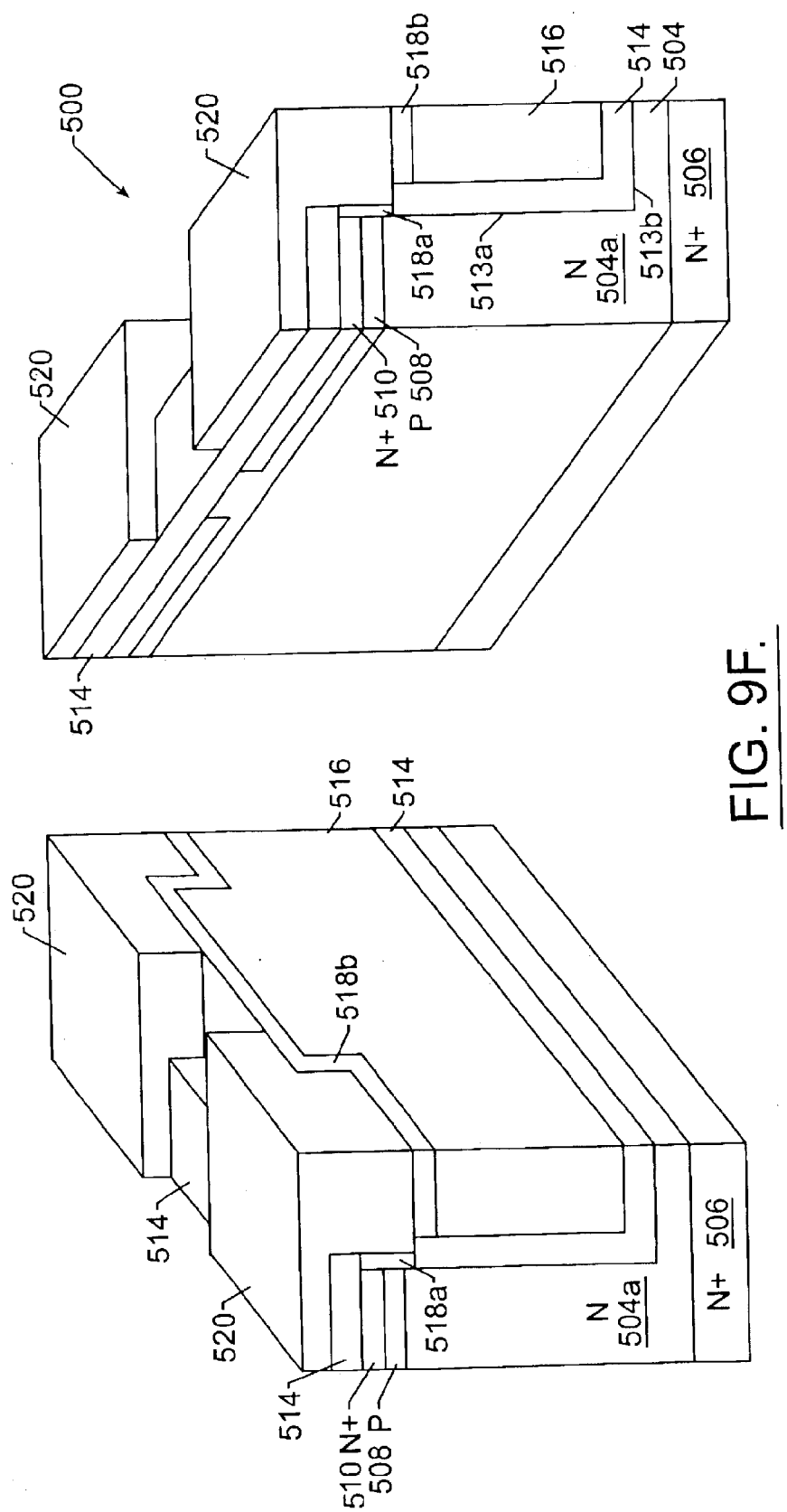

Referring now to FIG. 9F, a blanket gate conductive layer (e.g., polycide) may then be deposited and patterned as a plurality of parallel stripe-shaped gate electrodes 520 that extend lengthwise in the second direction (shown as orthogonal to the first direction) across the drift region mesas 504a and deep trenches 513. This patterning step may be performed using a fifth mask (not shown). Each stripe-shaped gate electrode 520 extends in the second direction across a plurality of drift region mesas 504a and also into a respective shallow trench 515 within each of a plurality of trench-based source electrodes 516. The gate electrodes 520 may also be patterned in a zigzag or other pattern and an acute angle between the lengthwise direction of the gate electrodes 520 and the lengthwise direction of the trench-based source electrodes 516 may be in a range between about 45° and about 90°.

Figure 9G:
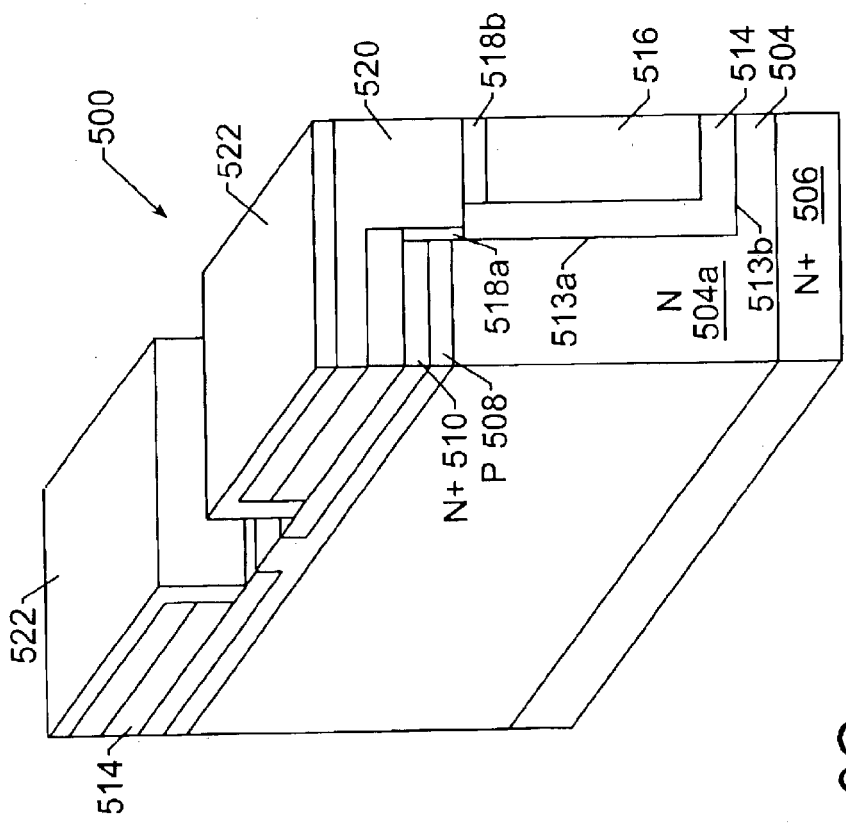
Figure 9G:
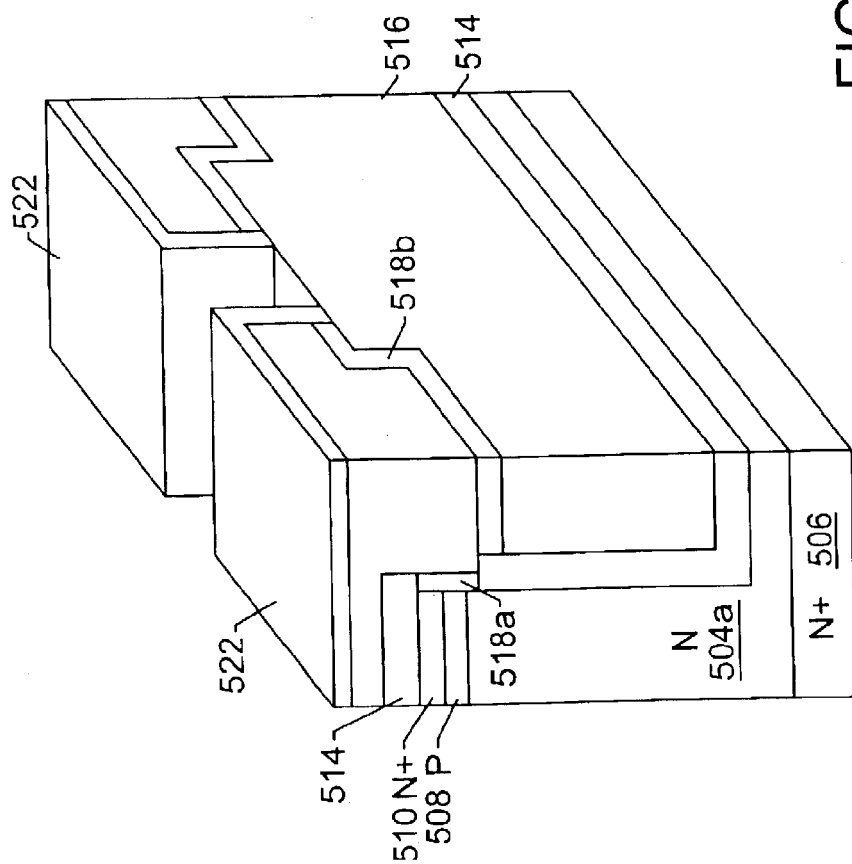
Figure 9H:
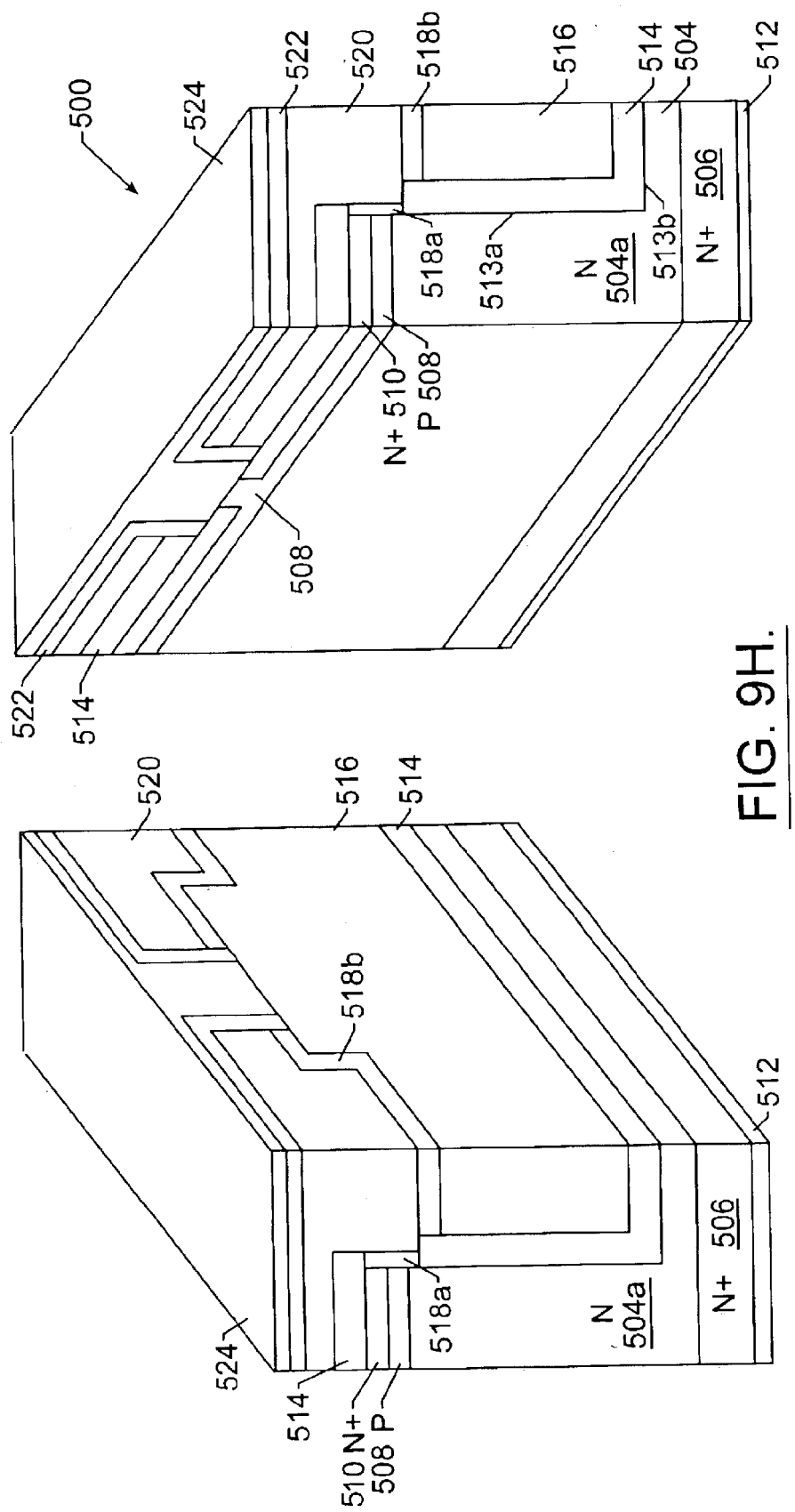

A blanket electrically insulating passivation layer 522 may then be deposited on the substrate 502, as illustrated by FIG. 9G. A sixth mask (not shown) may then be used during a selective etching step to expose respective portions of the source regions 510, base regions 508 and trench-based source electrodes 516 that extend between adjacent insulated gate electrodes 520. Referring now to FIG. 9H, a blanket layer of metallization may then be conformally deposited on the substrate and onto the exposed portions of the source region 508, base region 510 and buried insulated source electrode 516. The blanket layer of metallization may then be patterned using a seventh mask (not shown) to define a surface source electrode 524 that ohmically contacts each source region 508 and also ohmically contacts the base region 510 and buried insulated source electrode 516 at multiple locations along the first direction. These multiple contacts between each buried insulated source electrode and the surface source electrode 524 reduce the effective source electrode resistance and improve switching speed because this resistance is in the displacement current path associated with the MOS capacitor extending between each gate electrode 520 and respective buried source electrode 516. Another blanket layer of metallization may also be applied to define a drain electrode 512 that extends on the drain region 506.

Two-dimensional numerical simulations were performed on the vertical MOSFET of FIG. 9H. For each unit cell, the deep trench 513 had a depth and width of 5 microns and 1.8 microns, respectively, and the electrically insulating layer 514 lining the sidewalls 513a and bottom 513b of the deep trench 513 had a thickness of 350 nm (3500 Å). The drift region 504 had a thickness of six (6) microns. The shallow trenches 515 within each buried insulated source electrode 516 had a depth of 0.5 microns and the gate oxide 518a had a thickness of 40 nm (400 Å). The linear graded doping profile in the drift region 504 had a slope of $1.5 \times 10^{20}$ cm$^{-4}$ and the drift region mesa 504a had a width of 1 micron. Accordingly, the cell pitch associated with each unit cell was 2.8 microns. The source electrode 516 and gate electrode 520 comprised polysilicon and polycide, respectively. Based on these characteristics, the breakdown voltage was simulated as 85 Volts and a low specific on-state resistance (Rsp) of 0.25 milli-Ohm cm$^2$ was achieved. The specific gate charge $Q_t$ (to Vg=10 Volts) was found to be $4.93 \times 10^{-7}$ C/cm$^2$ and the specific Miller gate charge was found to be $8.6×10^{-8}$ C/cm². The Figure of Merit (FOM) corresponding to these results was $8.3×10^9$ (i.e., $R_{sp}×Q_t^{-1}=8.3×10^9$). In contrast, the vertical MOSFET of FIG. 1 was simulated using the same parameters (but without buried insulated source electrode) and yielded a breakdown voltage of 85 Volts and a much higher specific on-state resistance (Rsp) of 1.2 milli-Ohm cm². The specific gate charge $Q_t$ (to Vg=10 Volts) was found to be $3.0×10^{-7}$ C/cm² and the specific Miller gate charge was found to be $1.0×10^{-8}$ C/cm². The Figure of Merit (FOM) corresponding to these results was $2.8×10^9$, which is about one third the FOM for the device of FIG. 9H.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a vertical MOSFET, comprising the steps of:
   forming a base region of second conductivity type in a semiconductor substrate having a drift region of first conductivity type therein that forms a P-N junction with the base region;
   forming a source region of first conductivity type in the base region;
   forming a deep trench having a sidewall that extends adjacent the base region, in the semiconductor substrate;
   lining the deep trench with a an electrically insulating layer;
   refilling the lined deep trench with a trench-based source electrode;
   selectively etching the trench-based source electrode to define a shallow trench therein and expose a portion of the electrically insulating layer that extends on the sidewall of the deep trench;
   selectively etching the portion of the electrically insulating layer to expose an upper portion of the sidewall of the deep trench and reveal the base region;
   lining the shallow trench with a gate insulating layer that extends on the exposed upper portion of the sidewall of the deep trench and a bottom and sidewalls of the shallow trench;
   forming a gate electrode that extends on a surface of the semiconductor substrate and extends into the lined shallow trench; and
   forming a surface source electrode that electrically connects the trench-based source electrode, source region and base region together.

2. The method of claim 1, wherein said step of forming a surface source electrode is preceded by the steps of:
   forming a blanket passivation layer on the semiconductor substrate; and
   patterning the blanket passivation to define contact holes therein that expose the trench-based source electrode, source region and base region.

3. The method of claim 1, wherein the trench-based source electrode comprises polycrystalline silicon; and wherein said step of lining the shallow trench comprises thermally oxidizing the exposed upper portion of the sidewall at a first rate and the bottom and sidewalls of the shallow trench at a second rate that is higher than the first rate.

4. The method of claim 3, wherein said thermally oxidizing step comprises thermally oxidizing an upper surface of the trench-based source electrode to define a surface oxide layer thereon; and wherein said step of forming a surface source electrode is preceded by the step of selectively etching a portion of surface oxide layer extending adjacent the gate electrode to expose a portion of the upper surface of the trench-based source electrode.

5. The method of claim 1, wherein said step of lining the shallow trench comprises thermally oxidizing the exposed upper portion of the sidewall at a first rate and the bottom and sidewalls of the shallow trench at a second rate that is at least about equal to the first rate.

6. A method of forming a vertical MOSFET, comprising the steps of:
   forming a semiconductor substrate having therein a drift region, a transition region on the drift region, a base region on the transition region and a source region on the base region;
   forming a deep trench having a first sidewall that extends adjacent the base, transition and drift regions, in the semiconductor substrate;
   forming a trench-based source electrode in the deep trench;
   forming a shallow trench that exposes the base region and source region extending along the sidewall, in the trench-based source electrode;
   forming a gate oxide insulating layer on the exposed base region;
   forming a gate electrode that extends on an upper surface of the semiconductor substrate and extends into the shallow trench; and
   forming a surface source electrode that electrically connects the trench-based source electrode, source region and base region together.

7. The method of claim 5, wherein said step of forming a surface source electrode is preceded by the steps of:
   forming a blanket passivation layer on the semiconductor substrate; and
   patterning the blanket passivation to define contact holes therein that expose the trench-based source electrode, source region and base region.

8. The method of claim 6, wherein said step of forming a gate electrode comprises forming multiple stripe-shaped gate electrodes that extend across the trench-based source electrode in a direction orthogonal to a lengthwise direction of the deep trench; and wherein the surface source electrode electrically connects the trench-based source electrode, source region and base region at locations extending between the multiple stripe-shaped gate electrodes.

9. The method of claim 6, wherein the trench-based source electrode is separated from the sidewall by a an electrically insulating layer; and wherein said step of forming a shallow trench comprises selectively etching a portion of the electrically insulating layer exposed by the shallow trench using the trench-based source electrode as an etching mask.

* * * * *

UNITED STATES PATENT AND TRADEMARK OFFICE
CERTIFICATE OF CORRECTION

PATENT NO. : 6,764,889 B2  Page 1 of 1
DATED : July 20, 2004
INVENTOR(S) : Bantval Jayant Baliga It is certified that error appears in the above-identified patent and that said Letters Patent is hereby corrected as shown below:

Column 21,
Lines 32 and 46, please delete "a"

Column 22,
Line 24, please delete "first"
Line 58, please delete "a"

Signed and Sealed this

Thirtieth Day of November, 2004

JON W. DUDAS
*Director of the United States Patent and Trademark Office*